United States Patent
Kitamura

(10) Patent No.: US 9,035,700 B2
(45) Date of Patent: May 19, 2015

(54) VARIABLE GAIN AMPLIFIER

(71) Applicant: Panasonic Corporation, Osaka (JP)

(72) Inventor: Ryo Kitamura, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/131,819

(22) PCT Filed: Dec. 5, 2012

(86) PCT No.: PCT/JP2012/007802
§ 371 (c)(1),
(2) Date: Jan. 9, 2014

(87) PCT Pub. No.: WO2013/094138
PCT Pub. Date: Jun. 27, 2013

(65) Prior Publication Data
US 2014/0191804 A1    Jul. 10, 2014

(30) Foreign Application Priority Data

Dec. 20, 2011    (JP) ................................ 2011-278449

(51) Int. Cl.
| | |
|---|---|
| *H03G 3/00* | (2006.01) |
| *H03F 3/193* | (2006.01) |
| *H03G 9/14* | (2006.01) |
| *H03F 1/56* | (2006.01) |
| *H03F 3/45* | (2006.01) |

(52) U.S. Cl.
CPC ................. *H03F 3/193* (2013.01); *H03G 9/14* (2013.01); *H03F 1/56* (2013.01); *H03G 3/008* (2013.01); *H03F 3/45179* (2013.01); *H03F 2203/45394* (2013.01)

(58) Field of Classification Search
USPC ........................................... 330/282, 75, 278
IPC ....................................................... H03G 3/00
See application file for complete search history.

(56) References Cited

U.S. PATENT DOCUMENTS

| | | | | |
|---|---|---|---|---|
| 3,581,223 | A | * | 5/1971 | Armstrong .................... 330/280 |
| 4,540,952 | A | * | 9/1985 | Williams ...................... 330/279 |
| 4,608,542 | A | * | 8/1986 | Siegel .......................... 330/279 |

(Continued)

FOREIGN PATENT DOCUMENTS

| | | | |
|---|---|---|---|
| JP | 05-347520 | A | 12/1993 |
| JP | 06-152263 | A | 5/1994 |
| JP | 09-098032 | A | 4/1997 |

(Continued)

OTHER PUBLICATIONS

International Search Report for Application No. PCT/JP2012/007802 dated Feb. 26, 2013.

*Primary Examiner* — Patricia T Nguyen
(74) *Attorney, Agent, or Firm* — Pearne & Gordon LLP

(57) ABSTRACT

A variable gain amplifier (100) includes a transistor (110), an FB impedance section (120), a source impedance section (130), a drain impedance section (140), a gain controller (150), and a frequency characteristic controller (160). The gain controller (150) varies impedance of one of the FB impedance section (140), the source impedance section (130), and the drain impedance section (140), and outputs a gain control signal. The frequency characteristic controller (160) varies the impedance of different impedance section, based on the gain control signal.

11 Claims, 21 Drawing Sheets

(56) References Cited

U.S. PATENT DOCUMENTS 5,319,318 A * 6/1994 Kunihisa et al. ............. 330/282
2008/0211582 A1 * 9/2008 Lin ............................... 330/278

FOREIGN PATENT DOCUMENTS

| JP | 2002-151985 A | 5/2002 |
| JP | 2007-329675 A | 12/2007 |

* cited by examiner

| GAIN PARAMETER | Cs VALUE |
|---|---|
| $G_1$ | $C_1$ |
| $G_2$ | $C_2$ |

(b)

| GAIN PARAMETER | TEMPERATURE | Cs VALUE |
|---|---|---|
| $G_1$ | $T_1$ | $C_1$ |
| $G_1$ | $T_2$ | $C_2$ |
| $G_2$ | $T_1$ | $C_3$ |
| $G_2$ | $T_2$ | $C_4$ |

(c)

| GAIN PARAMETER | Cs VALUE |
|---|---|
| $G_1$ | $C_1$ |
| $G_2$ | $C_2$ |
| $G_3$ | $C_3$ |
| $G_4$ | $C_4$ |
| $G_5$ | $C_5$ |

*FIG.15*

| GAIN PARAMETER | $C_S$ VALUE | $C_D$ VALUE |
|---|---|---|
| $G_1$ | $C_1$ | $C_5$ |
| $G_2$ | $C_2$ | $C_6$ |
| $G_3$ | $C_3$ | $C_7$ |
| $G_4$ | $C_4$ | $C_8$ |

FIG.17

| GAIN PARAMETER | $C_{S1}$ VALUE | $C_{D1}$ VALUE | $C_{D2}$ VALUE |
|---|---|---|---|
| $G_1$ | $C_1$ | $C_5$ | $C_9$ |
| $G_2$ | $C_2$ | $C_6$ | $C_{10}$ |
| $G_3$ | $C_3$ | $C_7$ | $C_{11}$ |
| $G_4$ | $C_4$ | $C_8$ | $C_{12}$ |

FIG.20
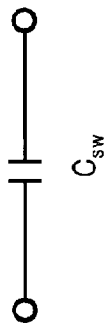
IDEAL SWITCH
(a)
ACTUAL SWITCH
$C_{sw}$
(c)
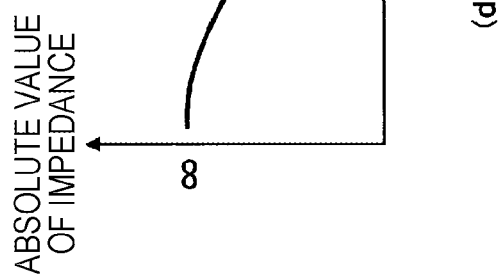
(b)
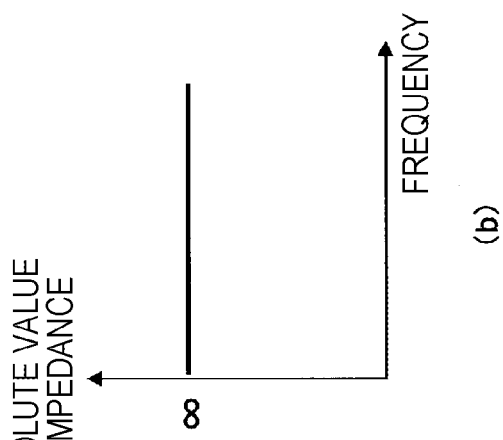
(d)

VARIABLE GAIN AMPLIFIER

TECHNICAL FIELD

The present disclosure relates to a variable gain amplifier that amplifies a signal level in wireless communication.

BACKGROUND ART

A variable gain amplifier is used in, e.g., a mobile phone or a communication terminal which supports a wireless LAN (Local Area Network), and amplifies a signal level in wireless communication.

The variable gain amplifier can be classified into two types, i.e., an analog-control variable gain amplifier that controls the impedance thereof with an analog voltage, and a digital-control variable gain amplifier that controls the impedance thereof with a digital voltage. Compared to the analog-control variable gain amplifier, the digital-control variable gain amplifier eliminates the need for a digital-to-analog converter (DAC) and can reduce current consumption and footprint.

For example, a variable gain amplifier of Patent Literature 1 is known as prior art relating to the digital-control variable gain amplifier. The variable gain amplifier of Patent Literature 1 is a digital-control variable gain amplifier of the differential input type that amplifies a differential input signal and outputs the amplified signal as a differential output signal. In the variable gain amplifier of Patent Literature 1, a switch, a resistance, and a switch are cascade-connected in this order between the source terminals of the respective first and second transistors serving as a differential pair. In the variable gain amplifier of Patent Literature 1, ON and OFF of the two switches are controlled by digital signals serving as control signals, and thus the impedance between ground and the source of each of the first and second transistors changes so as to vary a gain.

CITATION LIST

Patent Literature

Patent Literature 1: JP-A-2007-329675

SUMMARY OF INVENTION

Technical Problem

The present inventor has studied a variable gain amplifier that amplifies a signal level in wireless communication. However, in the variable gain amplifier of Patent Literature 1, parasitic capacitance $C_{sw}$ is actually generated even if the switches are OFF. Thus, the impedance decreases with the increase of a frequency. Consequently, it is difficult to obtain a desired gain-characteristic. Particularly, when using a broadband signal (e.g., a signal whose baseband bandwidth is 880 MHz) used in a 60 GHz-band short-range wireless communication system, the in-band deviation of the gain of the variable gain amplifier increases, so that signal distortion occurs.

The present disclosure is made in view of the above background and an object of the present disclosure is to provide a variable gain amplifier that reduces the in-band deviation of the gain, which occurs as the frequency increases.

Solution to Problem

The present disclosure provides a variable gain amplifier including: an amplifying element including a control terminal to which an input signal is input, a reference-side terminal connected to reference electric-potential, and a power-supply-side terminal connected to a direct-current power supply, the amplifying element configured to amplify the input signal; an FB impedance section connected between the control terminal and the power-supply-side terminal; a reference-side impedance section connected to the reference-side terminal; a power-supply-side impedance section connected to the power-supply-side terminal; a gain controller configured to control a gain of the amplifying element; and a frequency characteristic controller configured to control a frequency characteristic of the gain, wherein the gain controller varies an impedance of one impedance section of the FB impedance section, the reference-side impedance section, and the power-supply-side impedance section, and outputs a control signal for controlling the gain, and the frequency characteristic controller varies an impedance of an impedance section differing from the one impedance section, based on the control signal for controlling the gain.

Advantageous Effects of Invention

According to the present disclosure, the in-band deviation of the gain, which occurs as the frequency increases, can be reduced.

BRIEF DESCRIPTION OF DRAWINGS

FIG. 4 includes diagrams illustrating examples of a lookup table used in the first embodiment, in which (a) illustrates a first example, (b) illustrates a second example and (c) illustrates a third example.

FIG. 15 is a diagram illustrating an example of a lookup table used in the fifth embodiment.

FIG. 17 is a diagram illustrating an example of a lookup table used in the sixth embodiment.

FIG. 20 includes diagrams each illustrating a characteristic of a switch, in which (a) illustrates a characteristic of an ideal switch, (b) illustrates a frequency characteristic of the absolute value of the impedance of the ideal switch, (c) illustrates a characteristic of an actual switch and (d) illustrates a frequency characteristic of the absolute value of the impedance of the actual switch.

DESCRIPTION OF EMBODIMENTS

Figure 18:
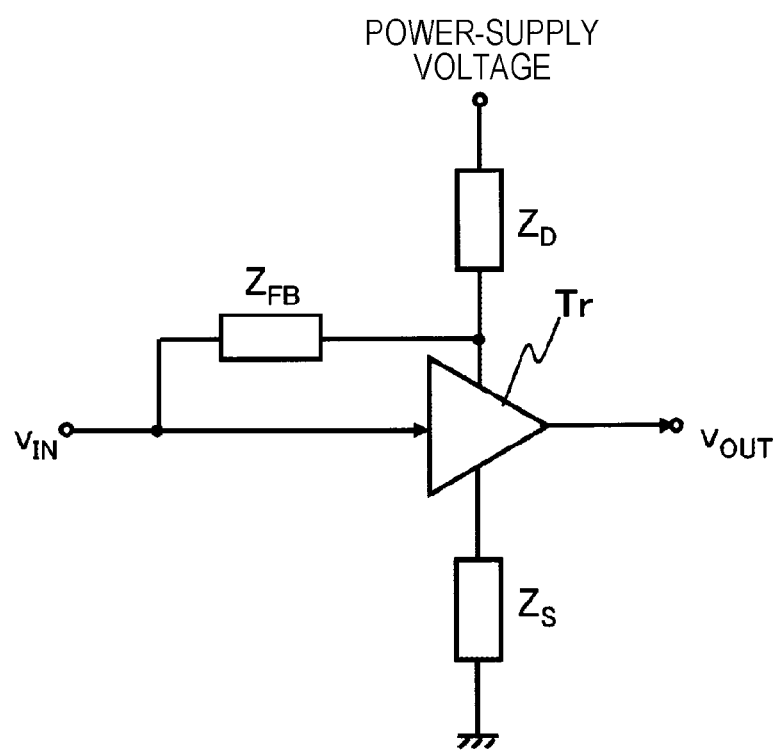
FIG. 18 is a circuit diagram illustrating an example of a circuit configuration of a variable gain amplifier in a related art.

Background for the Contents of Each Embodiment According to the Present Disclosure FIG. 18 is a circuit diagram illustrating an example of a circuit configuration of a variable gain amplifier 1000 in a related art. Symbols $Z_{FB}$, $Z_S$, and $Z_D$ represent the impedance between the power supply terminal and the gate terminal of a transistor $T_r$, the impedance between the source terminal of the transistor $T_r$ and ground, and the impedance between the drain terminal of the transistor $T_r$ and a power supply terminal, respectively. The variable impedance amplifier 1000 varies a gain expressed by expression (1) by changing at least one of the impedances $Z_{FB}$, $Z_S$, and $Z_D$.

[Expression 1]

$$G = \frac{v_{out}}{v_{in}} \qquad (1)$$
$$= -\frac{Z_D}{Z_D + Z_{FB}} \cdot \left( \frac{g_m Z_{FB}}{1 + Z_S g_m} - 1 \right)$$

Figure 19:
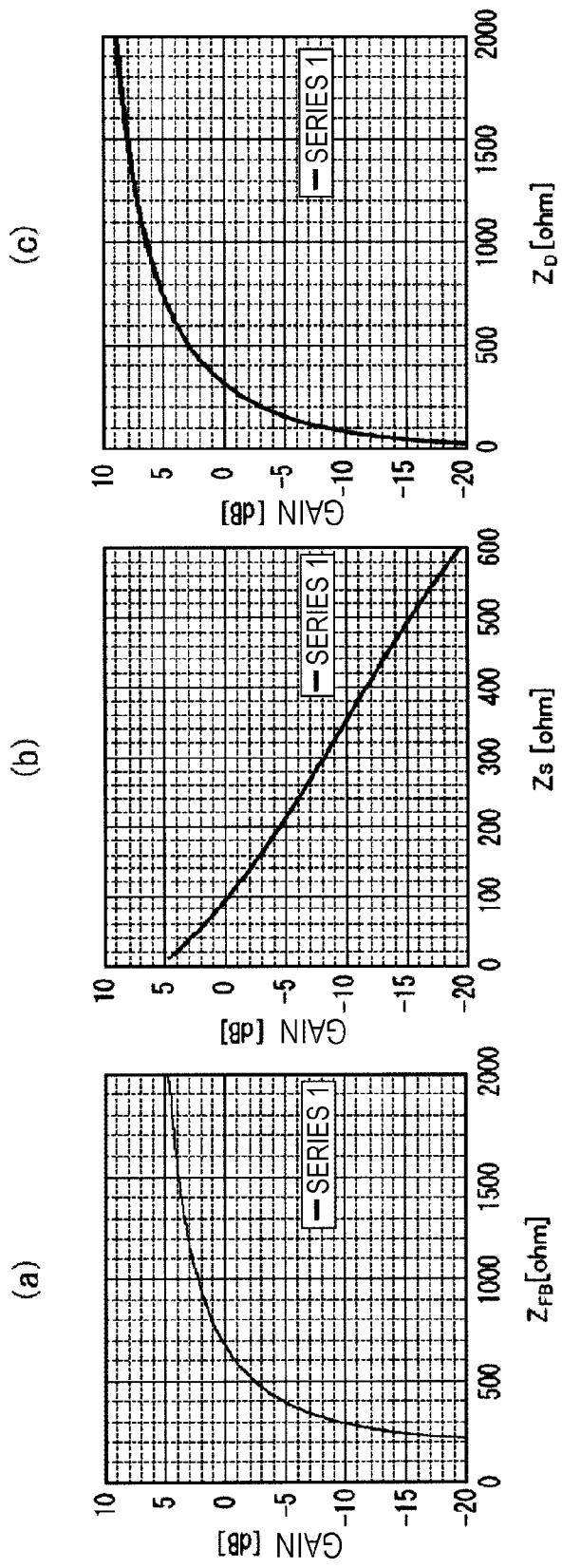
FIG. 19 includes graphs each illustrating an example of a gain characteristic of the variable gain amplifier in the related art, in which (a) illustrates a gain with respect to an impedance $Z_{FB}$, (b) illustrates a gain with respect to an impedance $Z_S$ and (c) illustrates a gain with respect to an impedance $Z_D$.

Symbol $g_m$ represents the transconductance of the transistor Tr. FIG. 19 includes graphs each illustrating an example of a gain characteristic of the variable gain amplifier in the related art. FIG. 19(a) illustrates the gain with respect to the impedance $Z_{FB}$. FIG. 19(b) illustrates the gain with respect to the impedance $Z_S$. FIG. 19(c) illustrates the gain with respect to the impedance $Z_D$. The gain increases with increase of the value of the impedance $Z_D$ or $Z_{FB}$ or with decrease of the value of the impedance $Z_S$.

FIG. 20 includes diagrams each illustrating a characteristic of a switch. FIG. 20(a) illustrates a characteristic of an ideal switch. FIG. 20(b) illustrates a frequency characteristic of the absolute value of the impedance of the ideal switch. FIG. 20(c) illustrates a characteristic of an actual switch. FIG. 20(d) illustrates a frequency characteristic of the absolute value of the impedance of the actual switch. In the ideal switch, the impedance becomes infinite, independent of the frequency. Thus, the frequency characteristic of the impedance becomes constant.

However, in the two switches cascade-connected in the variable gain amplifier of Patent Literature 1, even if each switch is OFF, the parasitic capacitance $C_{SW}$ actually occurs (see FIG. 20(c)). Each switch operates as an ideal switch for direct-current signals. However, because the parasitic capacitance $C_{SW}$ occurs for alternating-current signals if each switch is OFF, the impedance decreases with increase of the frequency (see FIG. 20(d)).

Figure 21:
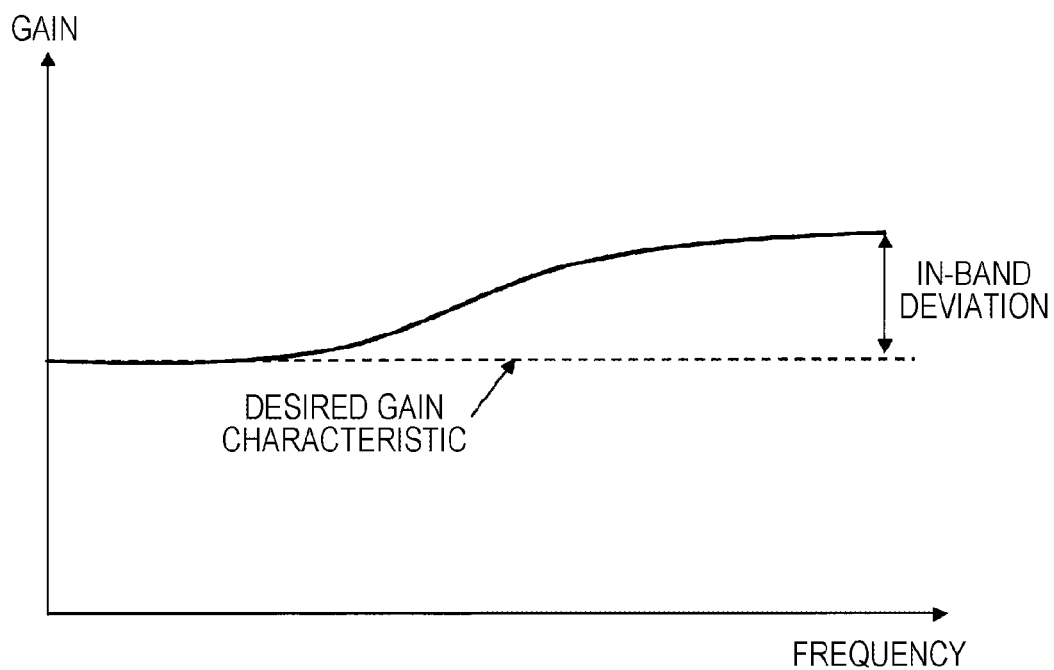
FIG. 21 is a diagram explaining problems of the variable gain amplifier in the related art.

FIG. 21 is a diagram explaining problems of the variable gain amplifier in the related art. When the impedance decreases with increase of the frequency, a desired gain characteristic (see a dashed line in FIG. 21) cannot be obtained. Thus, an in-band deviation increases, which is the difference between the maximum gain and the minimum gain in a signal bandwidth. Consequently, signal distortion occurs. Particularly, when using a signal having a wide signal band (e.g., a signal, whose baseband is in a frequency band of 880 MHz, to be treated on the basis of WiGig (Wireless Gigabit)), the in-band deviation of the gain increases.

Thus, in each of the following embodiments, an explanation is given of a variable gain amplifier that reduces the in-band deviation of the gain, which occurs with increase of frequency.

Each embodiment of the variable gain amplifier according to the present disclosure is described below with reference to the drawings.

First Embodiment

Figure 1:
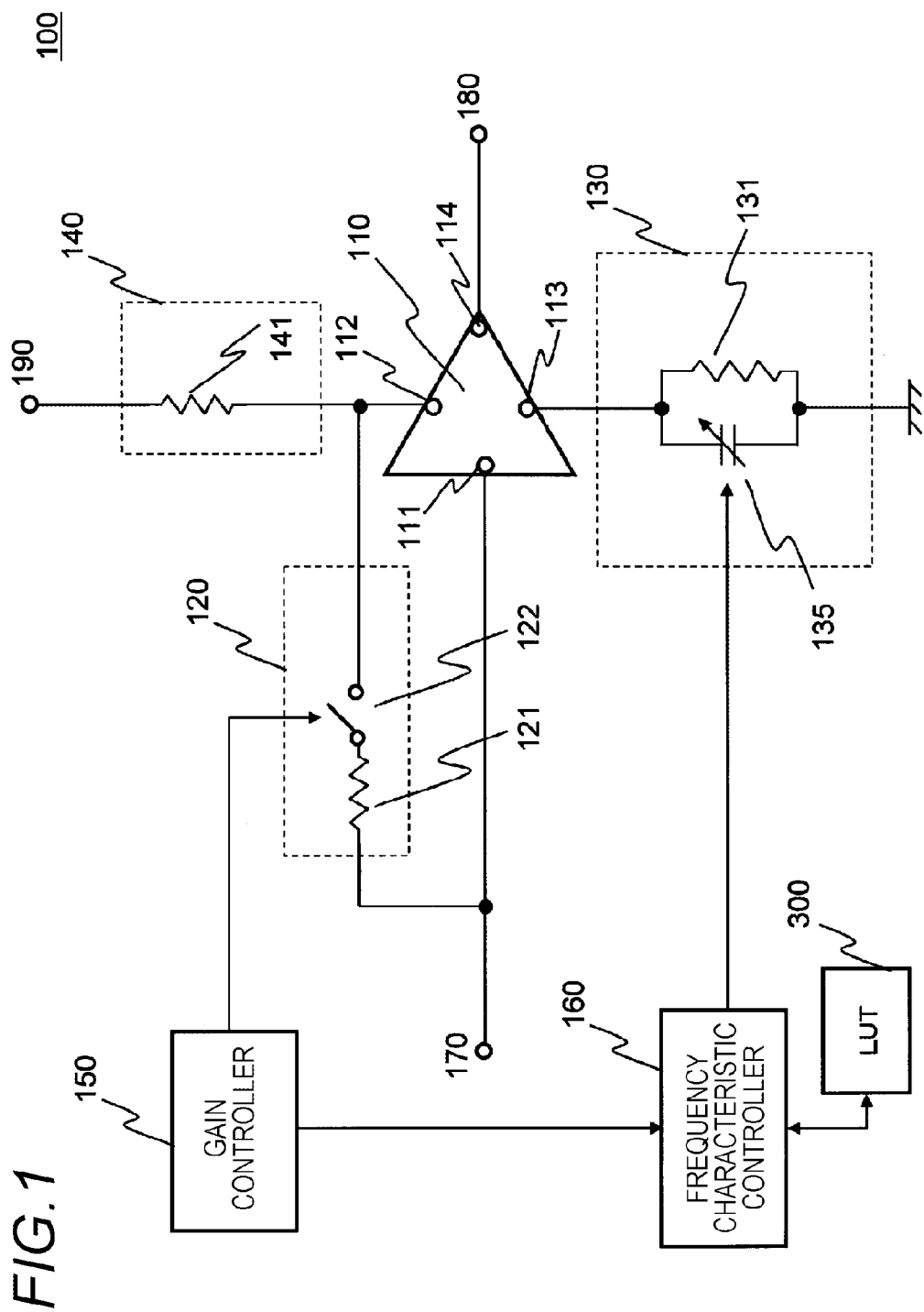
FIG. 1 is a diagram illustrating a circuit configuration of a variable gain amplifier according to a first embodiment.

FIG. 1 is a diagram illustrating a circuit configuration of a variable gain amplifier 100 according to a first embodiment. The variable gain amplifier 100 illustrated in FIG. 1 includes a transistor 110, an FB impedance section 120, a source impedance section 130, a drain impedance section 140, a gain controller 150, a frequency characteristic controller 160, input terminals 170, output terminals 180 and a power supply terminal 190.

The transistor 110 serving as an amplifying element includes a gate terminal 111 serving as a control terminal to which an input signal is input, a drain terminal 112 serving as a power-supply-side terminal connected to a direct-current power supply, a source terminal 113 serving as a reference-side terminal connected to a reference electric-potential (e.g., ground), and an output terminal 114.

The transistor 110 amplifies an input signal input to the gate terminal 111 and outputs the amplified signal from the output terminal 114 to the output terminal 180. A direct-current voltage is applied to the drain terminal 112 via the power supply terminal 190 and the drain impedance section 140. The source terminal 113 is grounded via the source impedance section 130.

The FB impedance section 120 includes a resistor 121 and a switch 122 and to be connected between the gate terminal 111 and the drain terminal 112 of the transistor 110. In the FB impedance section 120, the resistor 121 and the switch 122 are series-connected. The change between ON and OFF of the switch 122 causes change in the impedance between the gate terminal 111 and the drain terminal 112 of the transistor 110.

The source impedance section 130 serving as a reference-side impedance section includes a resistor 131 and a variable capacitor 135 and to be connected between the source terminal 113 of the transistor 110 and the reference electric-potential (ground). In the source impedance section 130, the resistor 131 and the variable capacitor 135 are parallel-connected. If the capacitance value of the variable capacitor 135 is changed, the impedance between the source terminal 113 and ground, i.e., the frequency characteristic of the source impedance section 130 changes.

The source impedance section 130 serving as the reference-side impedance section includes a resistor 131 and a variable capacitor 135 and to be connected between the drain terminal 112 of the transistor 110 and the power-supply terminal 190.

The gain controller 150 sets the gain of the variable gain amplifier 100 at a predetermined value by controlling ON and OFF of the switch 122 of the FB impedance section 120. The gain controller 150 outputs, to the frequency characteristic controller 160, a gain control signal including information that represents a predetermined value of the gain (hereinafter referred to as a "gain parameter").

The frequency characteristic controller 160 receives a gain control signal output from the gain controller 150 and varies the capacitance value of the variable capacitor 135 of the source impedance section 130, based on gain parameter information included in the gain control signal.

The frequency characteristic controller 160 reduces an in-band deviation of the gain, which is increased due to change in the impedance of the impedance section including the switch controlled by the gain controller 150, by changing the capacitance value of the variable capacitor of an impedance section that differs from the impedance section controlled by the gain controller 150.

A specific example of changing the capacitance value of the variable capacitor 135 by the frequency characteristic controller 160 is described hereinafter. The variable gain amplifier 100 sets the gain at a gain parameter G1 or G2 by setting the switch 122 of the FB impedance section 120 to ON or OFF.

That is, if the switch of the FB impedance section 120 is set to ON, the gain controller 150 sets the gain of the variable gain amplifier 100 at the gain parameter $G_1$. If the switch of the FB impedance section 120 is set to OFF, the gain controller 150 sets the gain of the variable gain amplifier 100 at the gain parameter $G_2$.

Figure 2:
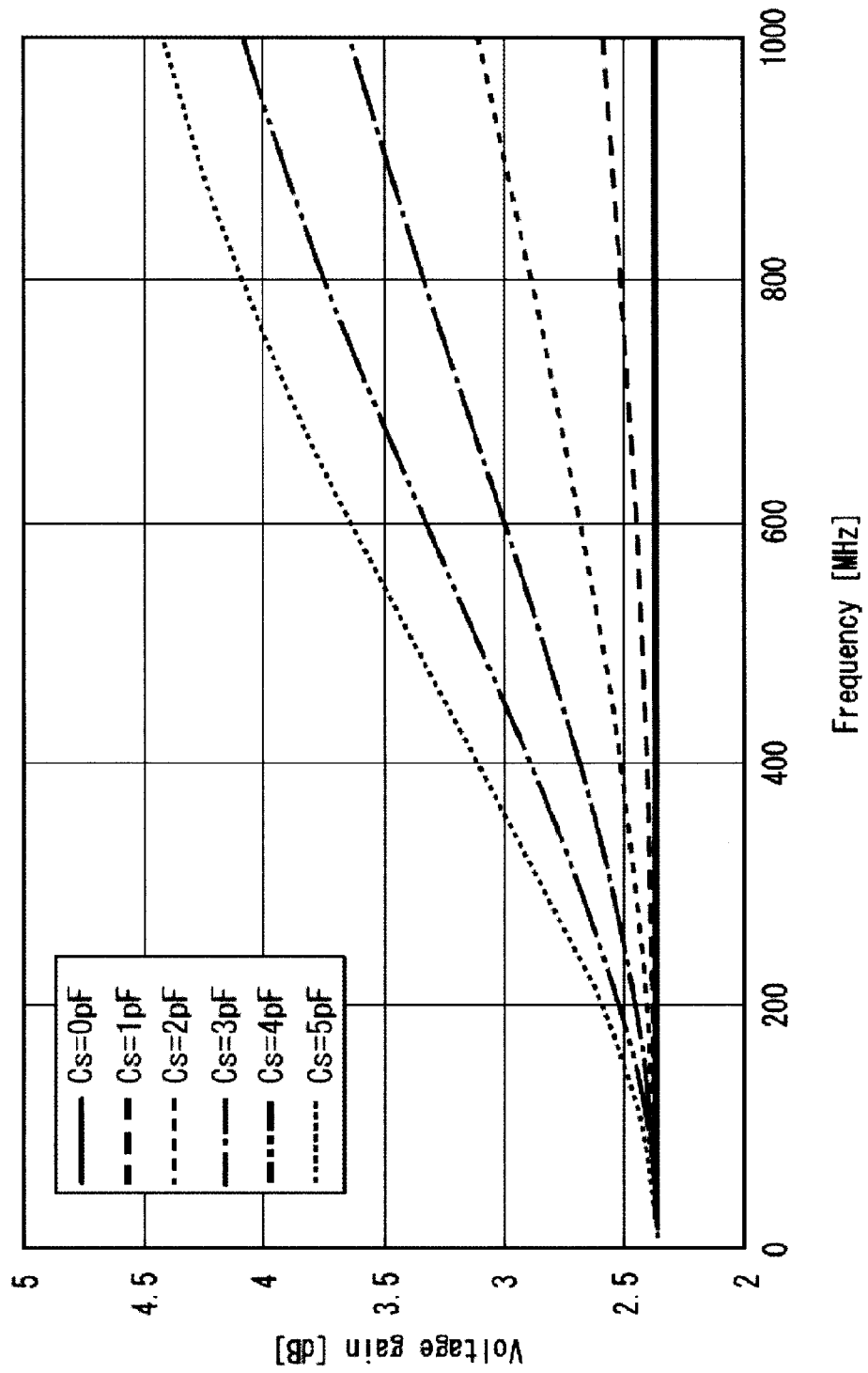
FIG. 2 is a graph illustrating a frequency-gain relationship with respect to a gain parameter $G_1$.
Figure 3:
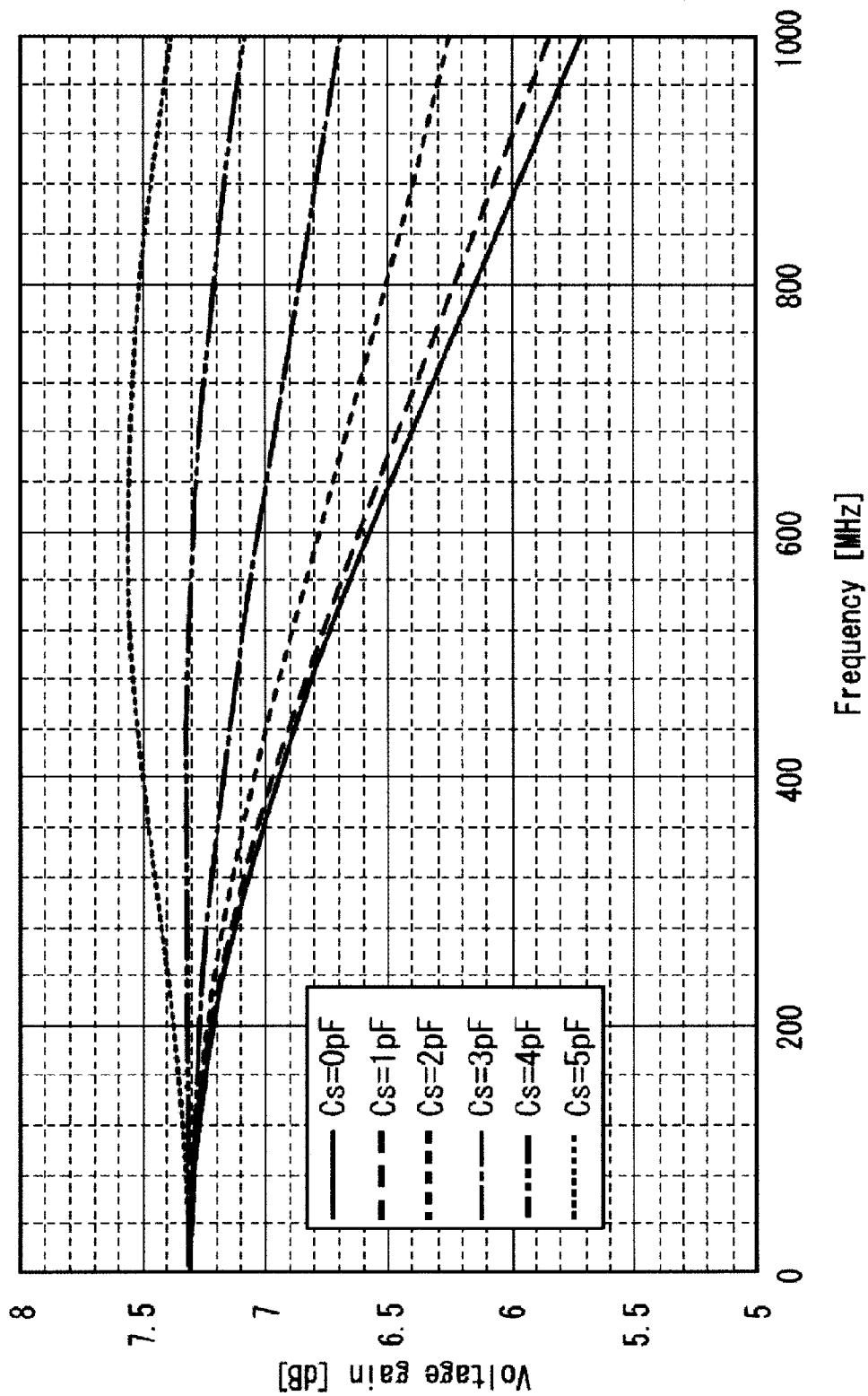
FIG. 3 is a graph illustrating a frequency-gain relationship with respect to a gain parameter $G_2$.

FIG. 2 is a graph illustrating the relationship between the frequency and the gain for the gain parameter $G_1$. FIG. 3 is a graph illustrating the relationship between the frequency and the gain for the two gain parameter $G_2$. FIGS. 2 and 3 illustrate the frequency characteristics of the gain in cases of setting the capacitance value $C_S$ of the gain at each of 0 pF, 1 pF, 2 pF, 3 pF, 4 pF, and 5 pF.

If the gain parameter is $G_1$, the switch 122 of the FB impedance section 120 is ON. Thus, the in-band deviation due to the above parasitic capacitance does not increase. Accordingly, the in-band deviation hardly occurs even if the capacitance value $C_S$ of the variable capacitor 135 is 0. When the capacitance $C_S$ of the variable capacitor 135 is increased, the impedance of the source impedance section 130 in a high-frequency region is reduced. Consequently, the gain of the frequency in the high-frequency region increases, and the in-band deviation increases. Thus, if the gain parameter is $G_1$, the capacitance value $C_S$ is set to 0.

On the other hand, if the gain parameter is $G_2$, the switch 122 of the FB impedance section 120 is OFF. Thus, the in-band deviation due to the above parasitic capacitance increases. If the capacitance value $C_S$ of the variable capacitor 135 is 0, the impedance of the FB impedance section 120 decreases with increase of the frequency. Thus, the gain of the variable gain amplifier 100 decreases, while the in-band deviation increases. If the capacitance value $C_S$ of the variable capacitor 135 is increased, the impedance of the source impedance section 130 in a high-frequency region decreases. Thus, the gain in the high-frequency region increases, while the in-band deviation decreases.

However, if the capacitance value $C_S$ of the variable capacitor 135 is excessively increased, the gain in a high-frequency region is increased, and the in-band deviation is increased. Thus, the frequency characteristic controller 160 uses the capacitance value $C_S$ at which the in-band deviation is minimized. It is seen from FIG. 3 that the capacitance value $C_S$, at which the in-band deviation is minimized, is a value between 4 pF and 5 pF.

For example, the frequency characteristic controller 160 stores lookup tables (LUTs) respectively illustrated in FIGS. 4(a) to (c) and determines a capacitance value $C_S$ based on the gain parameter information included in a gain control signal output from the gain controller 150 by referring to the lookup tables. The frequency characteristic controller 160 sets the capacitance value $C_S$ determined by the lookup table as the capacitance value $C_S$ of the variable capacitor 135 of the source impedance section 130. Consequently, even when, e.g., a high-frequency signal, whose baseband is 800 MHz band, is input to the variable gain amplifier 100 and the gain is set at the gain parameter $G_2$ (the switch 122 is OFF), the in-band deviation of the gain can be reduced.

FIG. 4 is a diagram illustrating an example of a lookup table used in the first embodiment. FIG. 4(a) illustrates a first example of the lookup table. FIG. 4(b) illustrates a second example of the lookup table. FIG. 4(c) illustrates a third example of the lookup table. The lookup tables may be written in a memory (not shown) included in the frequency characteristic controller 160, and may be written in a memory (not shown) of the variable gain amplifier 100, which is formed separately from the frequency characteristic controller 160. The same goes for each of the following embodiments.

The capacitance values ($C_1$ to $C_5$) in each lookup table are previously calculated as values, at which the in-band deviation to the frequency is reduced, using results of a simulation based on the circuit configuration or the circuit constant of the actual variable gain amplifier 100. Incidentally, the frequency characteristic controller 160 may be configured to calculate the capacitance value $C_S$ corresponding to the gain parameter each time using a known formula without storing the lookup tables.

The capacitance values $C_S$ other than those respectively corresponding to the gain parameters shown in FIG. 4(a) may be previously calculated by including values of each temperature shown in FIG. 4(b) in calculation. The same goes for each of the embodiments described below. The temperature represents, e.g., an ambient temperature of the variable gain amplifier 100.

Additionally, the capacitance value $C_S$ is not limited to the value previously calculated on the basis of the gain parameter and the temperature. The capacitance value $C_S$ may be calculated by including, in calculation, e.g., the battery-power-supply voltage of the device that includes a variable gain amplifier 100, or a modulation method (e.g., QPSK method) for a modulation signal transmitted from a transmitter. The same goes for each of the embodiments described below.

If the FB impedance section 120 includes plural resistors and plural switches, the variable gain amplifier 100 may be enabled to set three or more gain parameters (e.g., $G_1$ to $G_5$). The same goes for the embodiments described below. For example, in the case illustrated in FIG. 4(c), all the capacitance values $C_S$ (s=1, 2, 3, 4 and 5) respectively corresponding to the gain parameters are previously calculated by simulation. The frequency characteristic controller 160 varies the capacitance value of the variable capacitor 135 using the capacitance values $C_S$ respectively corresponding to the three or more gain parameters by referring to the lookup tables.

Figure 5:
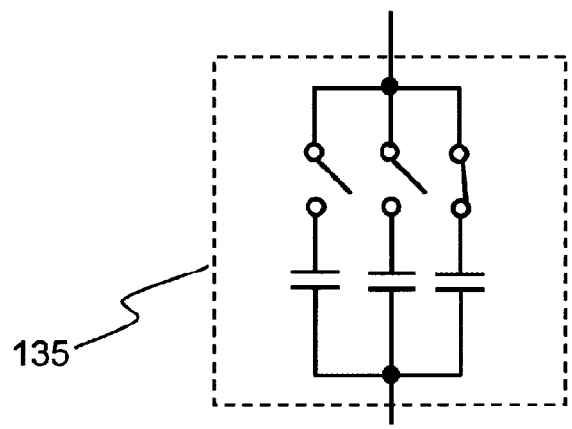
FIG. 5 illustrates an example of a circuit configuration of a variable capacitance of a source impedance section.

Incidentally, the variable capacitor 135 includes parallel-connected plural pairs each consisting of, e.g., a switch and a capacitor, which are series-connected. FIG. 5 is a diagram illustrating an example of a circuit configuration of the variable capacitor of the source impedance section. Note that the resistor 121 and the switch 122 of the FB impedance section 120 may be arranged in the reverse order.

Figure 6:
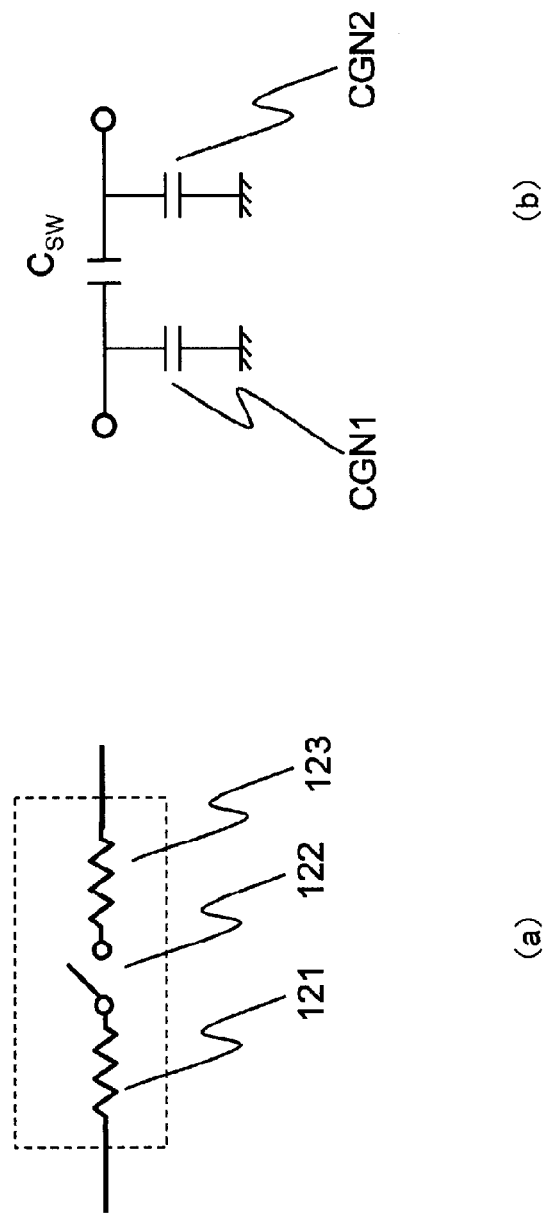
In FIG. 6, (a) is a diagram illustrating an example of the modification of the FB impedance section and (b) is a diagram illustrating a state in which parasitic capacitances CGN1 and CGN2 to ground occur in a switch 122.

The FB impedance section 120 shown in, e.g., FIG. 6(a) is configured to additionally include a resistor 123. FIG. 6(a) is a diagram illustrating a modification of the FB impedance section 120. FIG. 6(b) illustrates that each parasitic capacitance ($C_{GN1}$ and $C_{GN2}$) to ground is generated in the switch 122. In the configuration of the FB impedance section 120, the resistor 123 is provided to be symmetrical to the resistor 121 with respect to the switch 122, and to thereby alleviate the influence of the parasitic capacitance $C_{GN2}$, the frequency characteristic of the gain of the variable gain amplifier 100 illustrated in FIG. 3 can be improved. The influence of the in-band deviation of the gain can be reduced.

This is because if the resistor 123 is not added, the parasitic capacitance $C_{GN2}$ is directly connected to the drain terminal 112 of the transistor 110, so that influence on the frequency characteristic increases. Here, if the resistor 123 is added, the parasitic capacitance $C_{GN2}$ is connected to the drain terminal 112 of the transistor 110 via the resistor 123. Thus, the influence of the frequency characteristic is reduced.

Incidentally, when the resistance value of the resistor 121 is divided by two, the resistance value of the resistor 121 is halved. The resistance value between the gate terminal 111 of the transistor 110 and the parasitic capacitance $C_{GN1}$ is halved. Thus, the influence of the parasitic capacitance $C_{GN1}$ on the frequency characteristic is somewhat increased. However, this effect is small, as compared with the effect of reducing the influence of the parasitic capacitance $C_{GN2}$. Consequently, the frequency characteristic is mitigated, as the whole of the variable gain amplifier 100.

Figure 7:
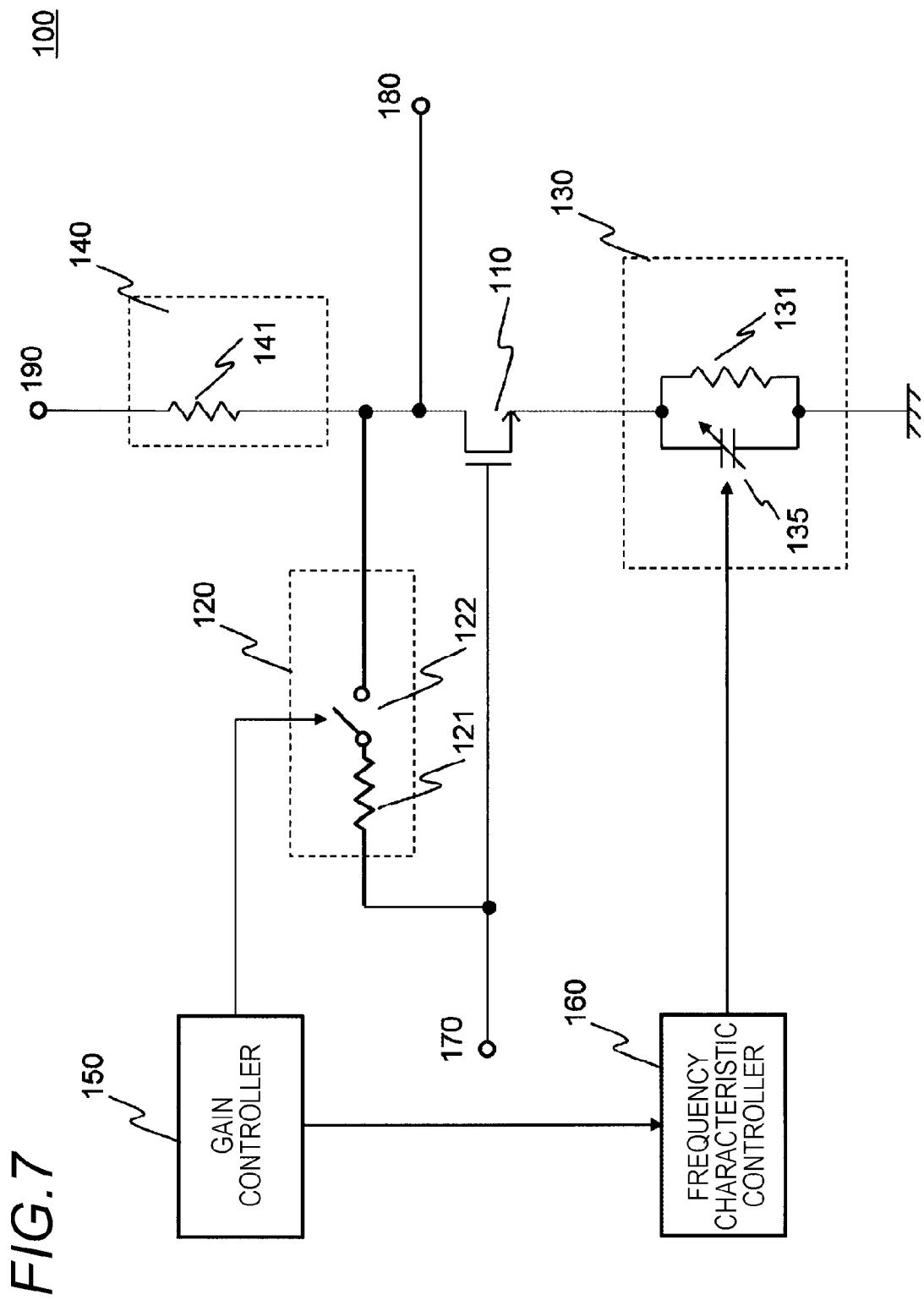
FIG. 7 is a diagram illustrating a specific circuit configuration of the variable gain amplifier according to the first embodiment.

FIG. 7 is a diagram illustrating a specific circuit configuration of the variable gain amplifier 100 according to the first embodiment. In the variable gain amplifier 100 shown in FIG. 7, the transistor 110 is an n-channel MOSFET (Metal Oxide Semiconductor Field Effect Transistor).

Figure 8:
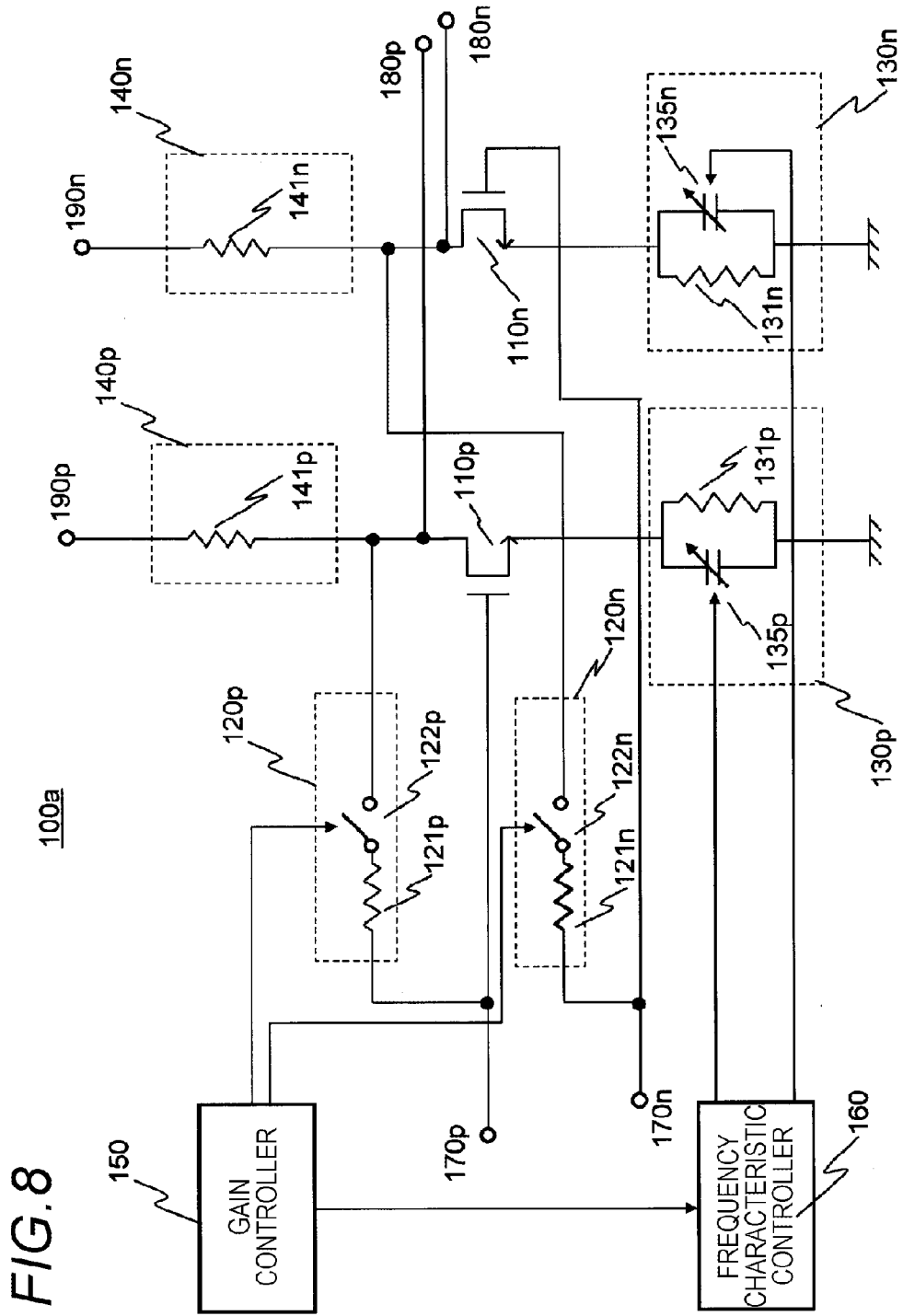
FIG. 8 is a diagram illustrating a specific circuit configuration of the variable gain amplifier according to the first embodiment, which is configured using two transistors forming a differential pair.

The variable gain amplifier 100 according to the present embodiment has been configured such that a single-ended signal is input thereto. However, even if the variable gain amplifier 100 is configured, as shown in FIG. 8, such that a differential signal is input thereto, the same effect can be obtained. FIG. 8 is a diagram illustrating a specific circuit configuration of the variable gain amplifier according to the first embodiment in the case where the variable gain amplifier is configured using two transistors 110p and 110n that serve as a differential pair. In the variable gain amplifier 100a shown in FIG. 8, similarly, each of the transistors 110n and 110p serving as a differential pair is an n-channel MOSFET.

The configuration of a variable gain amplifier 100a illustrated in FIG. 8 is briefly described hereinafter. Incidentally, the description of components in FIG. 8 is simplified or omitted by additionally attaching reference symbol "p" to the same components as those shown in FIG. 7 or FIG. 1. Thus, components to each of which reference symbol "n" is additionally attached are described hereinafter.

The variable gain amplifier 100a shown in FIG. 8 includes the transistors 110p and 110n, FB impedance sections 120p and 120n, source impedance sections 130p and 130n, drain impedance sections 140p and 140n, a gain controller 150, a frequency characteristic controller 160, input terminals 170p and 170n, output terminals 180p and 180n and power supply terminals 190p, and 190n.

The transistor 110n serving as an amplifying element receives a differential input signal serving as one of signals respectively input to a differential pair, the other of which is an input signal to be input to the gate terminal of the transistor 110p. Then, the transistor 110n amplifies the received signal and outputs the amplified differential input signal to the output terminal 180n.

The FB impedance section 120n includes a resistor 121n and a switch 122n and to be connected between the gate terminal and the drain terminal of the transistor 110n. In the FB impedance section 120n, the resistor 121n and the switch 122n are series-connected. The impedance between the gate terminal 111 and the drain terminal 112 of the transistor 110 is changed due to change between ON and OFF of the switch 122n.

The source impedance section 130n includes a resistor 131n and a variable capacitor 135n and to be connected between the source terminal of the transistor 110n and the reference electric-potential (ground). In the source impedance section 130n, the resistor 131n and the variable capacitor 135n are parallel-connected. If the capacitance value of the variable capacitor 135n is changed, the impedance between the source terminal and ground, i.e., the frequency characteristic of the impedance of the source impedance section 130n changes.

The drain impedance section 140n includes a resistor 141n and to be connected between the drain terminal of the transistor 110n and the power supply terminal 190n.

The gain controller 150 sets the gain of the variable gain amplifier 100a at a predetermined value by controlling ON and OFF of each of a switch 122p and the switch 122n respectively provided in the FB impedance sections 120p and 120n. The gain controller 150 outputs a gain control signal including gain parameter information to the frequency characteristic controller 160.

The frequency characteristic controller 160 receives a gain control signal output from the gain controller 150, and changes the capacitance value of each of variable capacitors 135p and 135n respectively provided in the source impedance sections 130p and 130n, based on gain parameter information included in the gain control signal. A control method used by the frequency characteristic controller 160 for controlling the capacitance value of each of the variable capacitors 135p and 135n in the variable gain amplifier 100a is similar to that used in the variable gain amplifier 100 shown in FIG. 1 or FIG. 7. Therefore, description of this control method is omitted.

Figure 9:
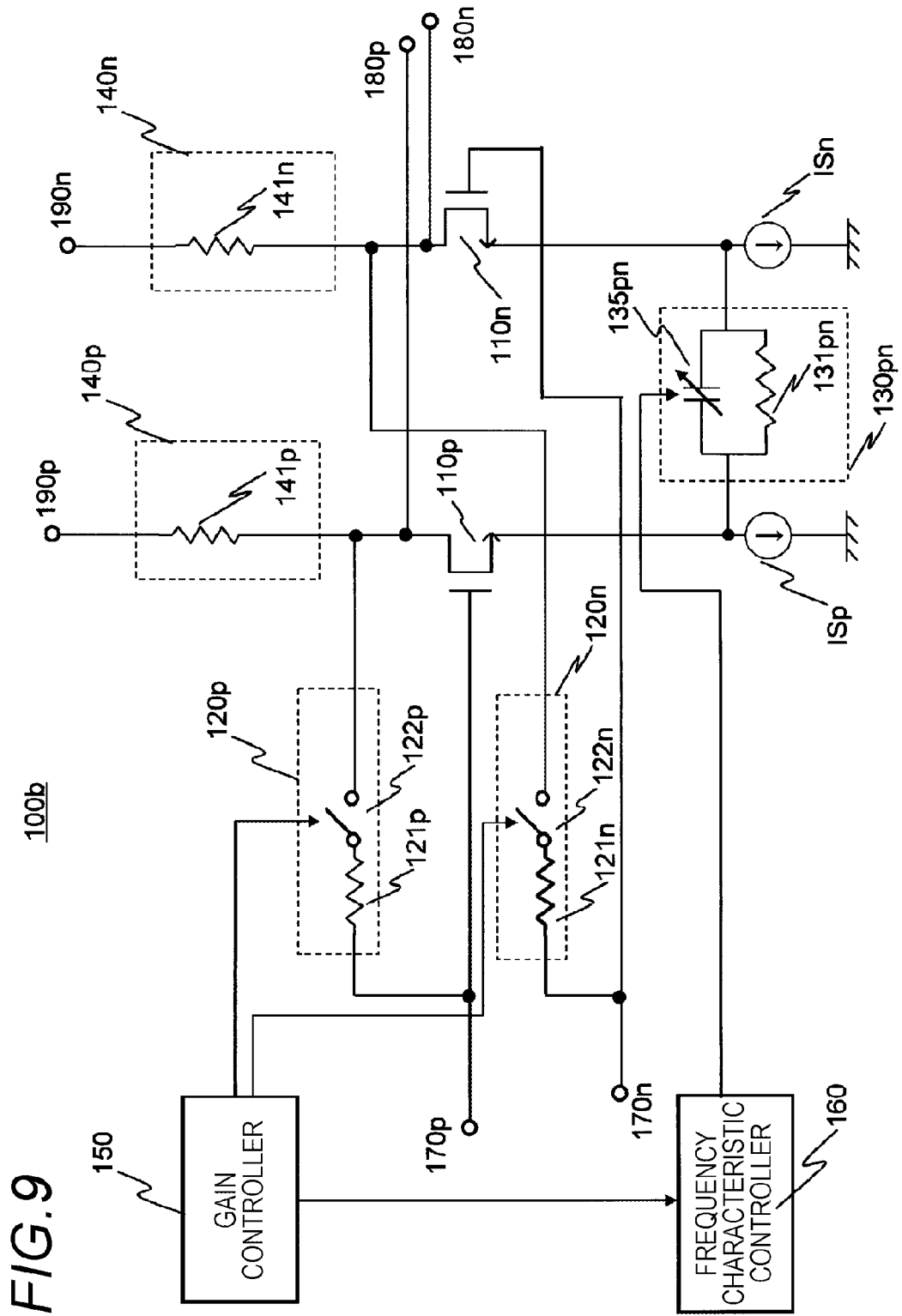
FIG. 9 is a diagram illustrating a circuit configuration of a first modification of the variable gain amplifier configured using two transistors forming a differential pair.

FIG. 9 is a diagram illustrating a circuit configuration of a variable gain amplifier 100b according to a first modification configured using two transistors 110p and 110n forming a differential pair. Description of components of the variable gain amplifier 100b shown in FIG. 9, which are similar to the components of the variable gain amplifier 100a shown in FIG. 8, is omitted. Different contents between the variable gain amplifiers are described hereinafter.

In the variable gain amplifier 100b, a source impedance section 130pn is connected between the source terminals of the transistors 110p and 110n, instead of the source impedance sections 130p and 130n shown in FIG. 8. A current source ISp is connected to the source terminal of the transistor 110p. A can source ISn is connected to the source terminal of the transistor 110n.

The source impedance section 130pn includes a resistor 131pn and a variable capacitor 135pn. In the source impedance section 130pn, the resistor 131pn and the variable capacitor 135pn are parallel-connected. If a sum of the resistance values of the resistors 131p and 131n is the resistance value of the resistor 131pn, a circuit configured by the source impedance section 130*pn* and the current sources ISp and ISn shown in FIG. 9 is an equivalent circuit of a circuit configured by the source impedance sections 130*p* and 130*n* shown in FIG. 8.

The frequency characteristic controller 160 receives a gain control signal output from the gain controller 150 and changes the capacitance value of the variable capacitor 135*pn* of the source impedance section 130*pn*, based on the gain parameter information included in the gain control signal. A control method for controlling the capacitance value of the variable capacitor 135*pn* of the frequency characteristic controller 160 in the variable gain amplifier 100*b* is similar to a control method used in the variable gain amplifier 100*a* shown in FIG. 8. Therefore, description of the former control method is omitted.

FIG. 9 is a diagram illustrating a circuit configuration of a variable gain amplifier 100*b* according to a first modification configured using two transistors 110*p* and 110*n* forming a differential pair. Description of contents of the variable gain amplifier 100*c* shown in FIG. 10, which are similar to the contents of the variable gain amplifier 100*a* shown in FIG. 8 and of the variable gain amplifier 100*b* shown in FIG. 9, is omitted. Different contents among the variable gain amplifiers are described hereinafter.

In the variable gain amplifier 100*c*, the variable capacitance 340*pn* is connected between the source terminals of the transistors 110*p* and 110*n*, instead of the source impedance sections 130*p* and 130*n* shown in FIG. 8. Additionally, a resistor 350*p* is connected to the source terminal of the transistor 110*p*. A resistor 350*n* is connected to the source terminal of the transistor 110*n*. The resistors 350*p* and 350*n* and the variable capacitor 340*p* form a source impedance section in the variable gain amplifier 100*c*.

Figure 10:
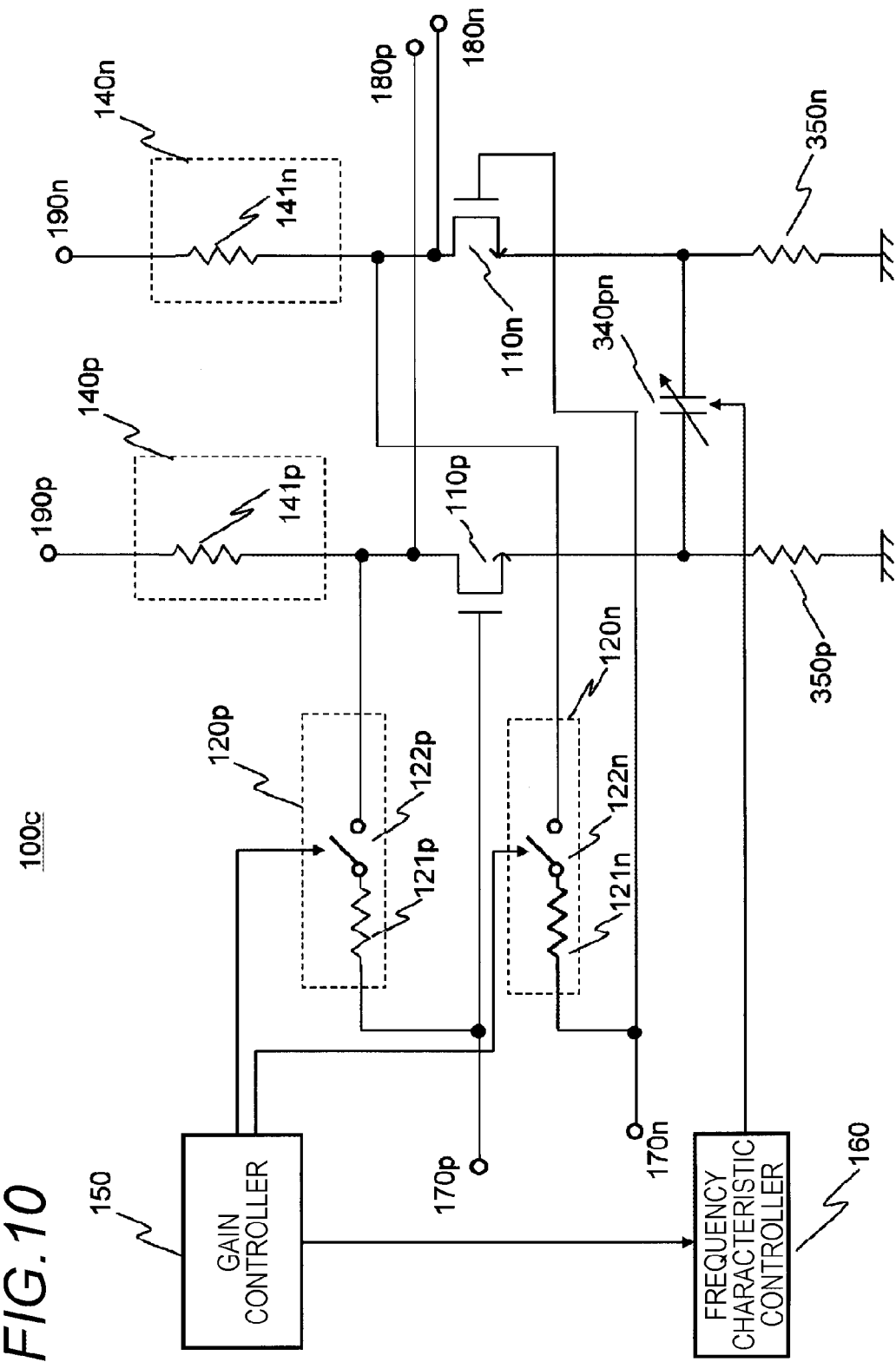
FIG. 10 is a diagram illustrating a circuit configuration of a second modification of the variable gain amplifier configured using two transistors forming a differential pair.

In a case where a sum of the resistance values of resistors 131*p* and 131*n* is the resistance value of each of the resistors 350*p* and 350*n*, and where the resistance values of the resistors 350*p* and 350*n* are equal to each other, a circuit of the source impedance section shown in FIG. 10 is an equivalent circuit of a circuit configured by the source impedance sections 130*p* and 130*n* shown in FIG. 8.

The frequency characteristic controller 160 receives a gain control signal output from the gain controller 150 and changes the capacitance value of the variable capacitor 340*pn* of the source impedance section, based on the gain parameter information included in the gain control signal. A control method for controlling the capacitance value of the variable capacitor 340*pn* of the frequency characteristic controller 160 is similar to the control method in the variable gain amplifier shown in FIG. 8. Thus, the description of the former control method is omitted.

Incidentally, the drain impedance section connected between one of the power supply terminals 190*p* and 190*n* and the drain terminal of an associated one of the transistors 110*p* and 110*n* and shown in FIGS. 8 to 10 may be configured similarly to the source impedance section.

Thus, in the case of using high-frequency signals, the variable gain amplifiers 100, 100*a* to 100*c* according to the first embodiment can reduce the in-band deviation that increases due to the parasitic capacitance of the switch of the FB impedance section for setting a gain. Accordingly, the variable gain amplifier can reduce signal distortion in an output signal.

It is not always necessary to previously calculate the capacitance values $C_S$ in the lookup tables by simulation. The same goes for each of the embodiments described below. For example, the capacitance values $C_S$ in the lookup tables may be rewritten on an as needed basis according to results of signal calibration performed in a device including the variable gain amplifier 100 at the power activation of the device or at a fixed predetermined time interval.

For example, a test signal generating portion (not shown) for outputting a test signal for calibration is provided on a transmission circuit side of the device. Thus, the test signal is sent to a receiving circuit side by switching the transmission circuit side to the receiving circuit side. The variable gain amplifier 100 may be adapted such that signal calibration is performed using a signal level of the test signal sent out to the receiving circuit side, that the capacitance values $C_S$ are calculated according to calibration results, and that the calculated capacitance values $C_S$ are written directly to the lookup tables.

The capacitance value $C_S$ of the variable capacitor 135 of the source impedance section 130 is calculated as a value at which the in-band deviation of the variable gain amplifier 100 is minimized. However, the capacitance value $C_S$ may be calculated as, e.g., a value at which the frequency characteristic of the gain is most improved as the whole transmitter, as the whole receiver, or as the whole transceiver. The same goes for each of the embodiments described below. More specifically, if the variable gain amplifier 100 is included in a receiver, the capacitance value CS may be calculated, at which the in-band deviation of the whole receiver including each in-band deviation in a low noise amplifier (LNA) and a downconverting mixer is minimized.

Alternatively, in the transmitter or the receiver, the fine adjustment of the in-band deviation of the gain may be performed in a signal processing portion for processing digital signals. It may be that the in-band deviation of the gain, which is used in the variable gain amplifier 100, is not necessarily minimized, that the rough adjustment of the in-band deviation of the gain is performed in the variable gain amplifier 100, that the fine adjustment of the gain is performed in the signal processing portion, and that the in-band deviation of the gain is reduced in the whole transmitter or the whole receiver. The same goes for each of the embodiments described below.

Second Embodiment

Figure 11:
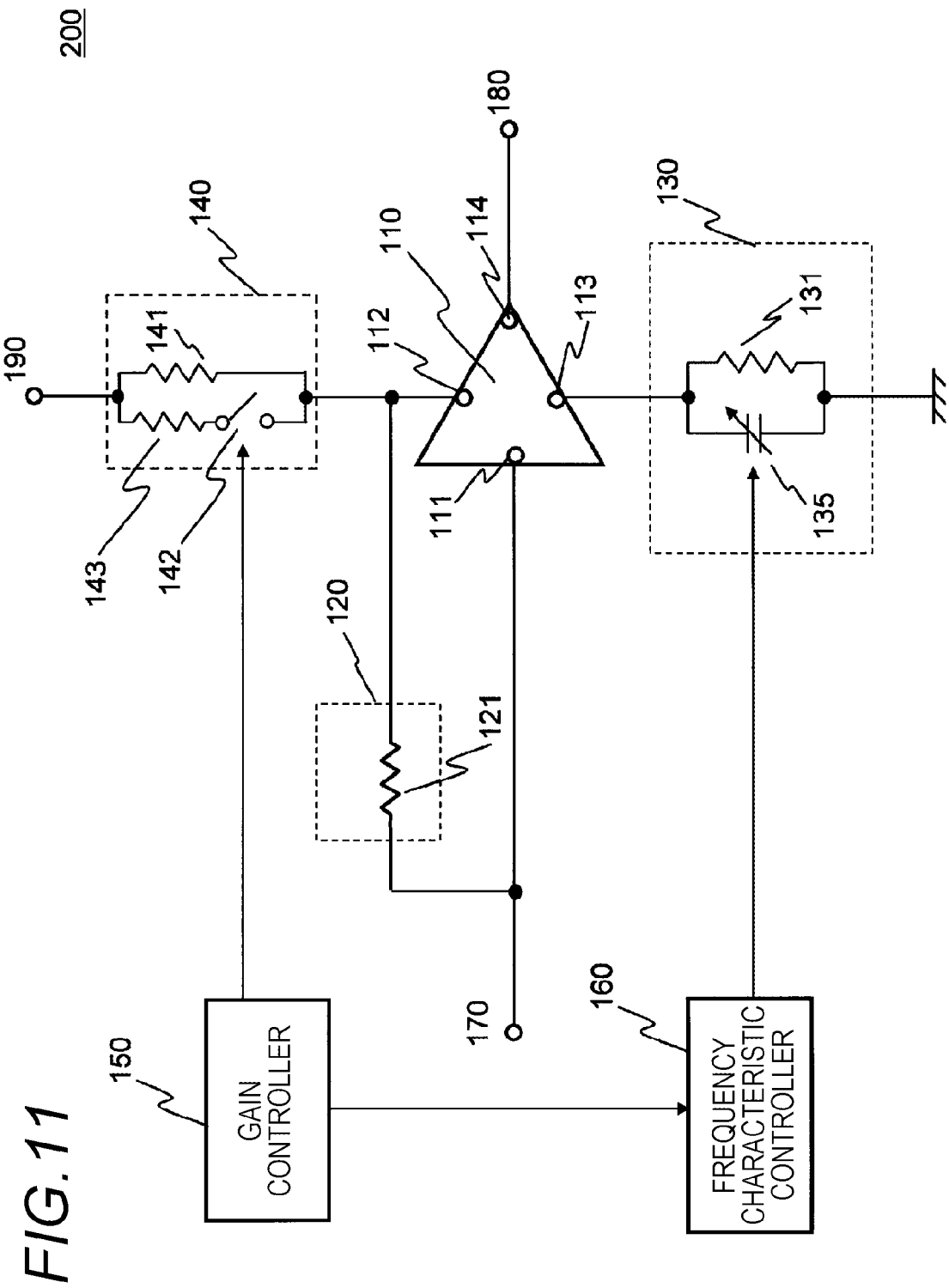
FIG. 11 is a diagram illustrating a circuit configuration of a variable gain amplifier according to a second embodiment.

FIG. 11 is a diagram illustrating a circuit configuration of a variable gain amplifier 200 according to a second embodiment. As compared with the variable gain amplifier 100 shown in FIG. 1, the variable gain amplifier 200 shown in FIG. 11 differs from the variable gain amplifier 100 in that the switch 122 is removed from the FB impedance section, and that resistors 142 and 143 are added to the drain impedance section 140.

In the description of the variable gain amplifier 200 shown in FIG. 11, a description of components similar to the components of the variable gain amplifier 100 shown in FIG. 1 is simplified or omitted by attaching similar reference numerals to such components. Different components are described hereinafter.

The FB impedance section 120 includes the resistor 121 and to be connected between the gate terminal 111 and the drain terminal 112 of the transistor 110.

The drain impedance section 140 includes a resistor 141, a switch 142, and a resistor 143, and to be connected between the drain terminal 112 of the transistor 110 and the power supply terminal 190. In the drain impedance section 140, the switch 142 and the resistor 143 are series-connected, and the resistor 141 is parallel-connected to the switch 142 and the resistor 143. The impedance between the drain terminal 112 and the power supply terminal 190 of the transistor 110 is changed due to change between ON and OFF of the switch 142.

The gain controller 150 sets the gain of the variable gain amplifier 200 at a desired value by controlling ON and OFF of the switch 142 of the drain impedance section 140. The gain controller 150 outputs a gain control signal including gain parameter information to the frequency characteristic controller 160.

The frequency characteristic controller 160 receives a gain control signal output from the gain controller 150 and changes the capacitance value of the variable capacitor 135 of the source impedance section 130, based on gain parameter information included in the gain control signal.

In the first embodiment, the frequency characteristic controller 160 reduces the in-band deviation of the gain, which is increased due to change between ON and OFF of the switch 122 of the FB impedance section 120, which is caused by the gain controller 150, by changing the capacitance value of the variable capacitor 135 of the source impedance section 130.

In the present exemplary embodiment, the frequency characteristic controller 160 reduces the in-band deviation of the gain, which is increased due to change between ON and OFF of the switch 142 of the drain impedance section 140, which is caused by the gain control section 150, by changing the capacitance value of the variable capacitor 135 of the source impedance section 130.

Accordingly, the frequency characteristic controller 160 controls the in-band deviation of the gain, which is increased due to change in the impedance of the impedance section including a switch controlled by the gain controller 150 by changing the capacitance value of the variable capacitor of the impedance section different from the impedance section controlled by the gain controller 150.

A control method of controlling the capacitance value of the variable capacitor 135 of the source impedance 130 in the frequency characteristic controller 160 is similar to the control method according to the first embodiment. Therefore, the description of the former control method is omitted.

Thus, similarly to the variable gain amplifier 100 according to the first embodiment, in the case of using a high-frequency signal, the variable gain amplifier 200 according to the second embodiment can reduce the in-band deviation of the gain, which is increased due to the parasitic capacitance of the switches in the drain impedance section for setting the gain. Accordingly, the variable gain amplifier 300 can reduce signal distortion in an output signal.

Incidentally, the resistance value of the resistor 121 shown in FIG. 11 may be infinite. That is, if the resistor 121 is not present, and even if the gate terminal 111 and the drain terminal 112 are detached from each other by the FB impedance section 120, the variable gain amplifier 200 according to the present embodiment can achieve the same effect as that of the variable gain amplifier 100.

Incidentally, although not shown to avoid complication of the drawings, the variable gain amplifier 200 may be configured such that differential signals are input thereto similarly as illustrated in FIGS. 8 to 10. The same goes for each of the embodiments described below.

Third Embodiment

Figure 12:
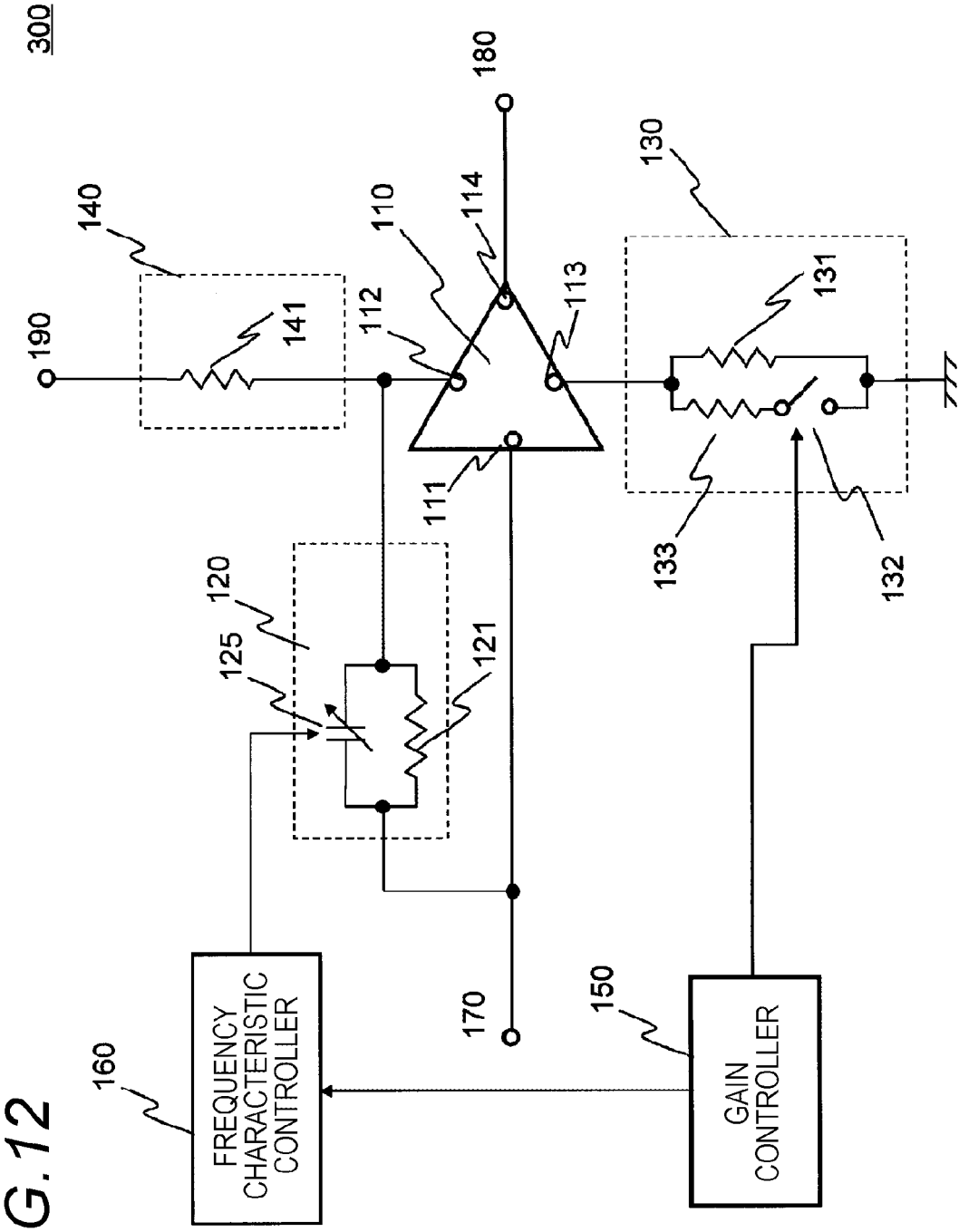
FIG. 12 is a diagram illustrating a circuit configuration of a variable gain amplifier according to a third embodiment.

FIG. 12 is a diagram illustrating a circuit configuration of a variable gain amplifier 300 according to a third embodiment. As compared with the variable gain amplifier 100 shown in FIG. 1, the variable gain amplifier 300 shown in FIG. 12 differs from the variable gain amplifier 100 in that the switch 122 is removed from the FB impedance section and a variable capacitor 125 is added thereto, and that a variable capacitor 135 is removed from the source impedance section 130 and a switch 132 and a resistor 133 are added thereto.

In the description of the variable gain amplifier 300 shown in FIG. 12, a description of components similar to the components of the variable gain amplifier 100 shown in FIG. 1 is simplified or omitted by attaching similar reference numerals to such components. Different components are described hereinafter.

The FB impedance section 120 includes a variable capacitor 125 and a resistor 121 and to be connected between the gate terminal 111 and the drain terminal 112 of the transistor 110. In the FB impedance section 120, the resistor 121 and the variable capacitor 125 are parallel-connected. If the capacitance value of the variable capacitor 125 changes, the frequency characteristic of the impedance between the gate terminal 111 and the drain terminal 112 changes.

The source impedance section 130 includes a resistor 131, a switch 132 and a resistor 133 and to be connected between the source terminal 113 of the transistor 110 and the reference electric-potential (ground). In the source impedance section 130, the switch 132 and the resistor 133 are series-connected. The resistor 131 is parallel-connected to the switch 132 and the resistor 133. The impedance between the source terminal 113 of the transistor 110 and the ground is changed.

The gain controller 150 sets the gain of the variable gain amplifier 300 at a desired value by controlling ON and OFF of the switch 132 of the source impedance section 130. The gain controller 150 outputs a gain control signal including gain parameter information to the frequency characteristic controller 160.

The frequency characteristic controller 160 receives the gain control signal output from the gain controller 150 and change the capacitance value of the variable capacitor 125 of the FB impedance section 120, based on the gain parameter information included in the gain control signal.

In the present embodiment, the frequency characteristic controller 160 reduces the in-band deviation of the gain, which is increased due to change between ON and OFF of the switch 132 of the source impedance section 130, which is caused by the gain controller 150 by changing the capacitance value of the variable capacitor 125 of the FB impedance section 120.

Accordingly, the frequency characteristic controller 160 reduces the in-band deviation of the gain, which is increased due to change in the impedance of the impedance section including a switch controlled by the gain controller 150 by changing the capacitance value of the variable capacitor of the impedance section different from the impedance section controlled by the gain controller 150.

A control method for controlling the capacitance value of the variable capacitor 125 of the FB impedance section 120, which is performed by the frequency characteristic controller 160, is similar to the control method performed in the first embodiment. Thus, a description of the former control method is omitted.

Thus, similarly to the variable gain amplifier 100 according to the first embodiment, in the case of using a high-frequency signal, the variable gain amplifier 300 according to the third embodiment can reduce the in-band deviation of the gain, which is increased due to the parasitic capacitance of the switches in the drain impedance section for setting the gain. Accordingly, the variable gain amplifier 200 can reduce signal distortion in an output signal.

Fourth Embodiment

Figure 13:
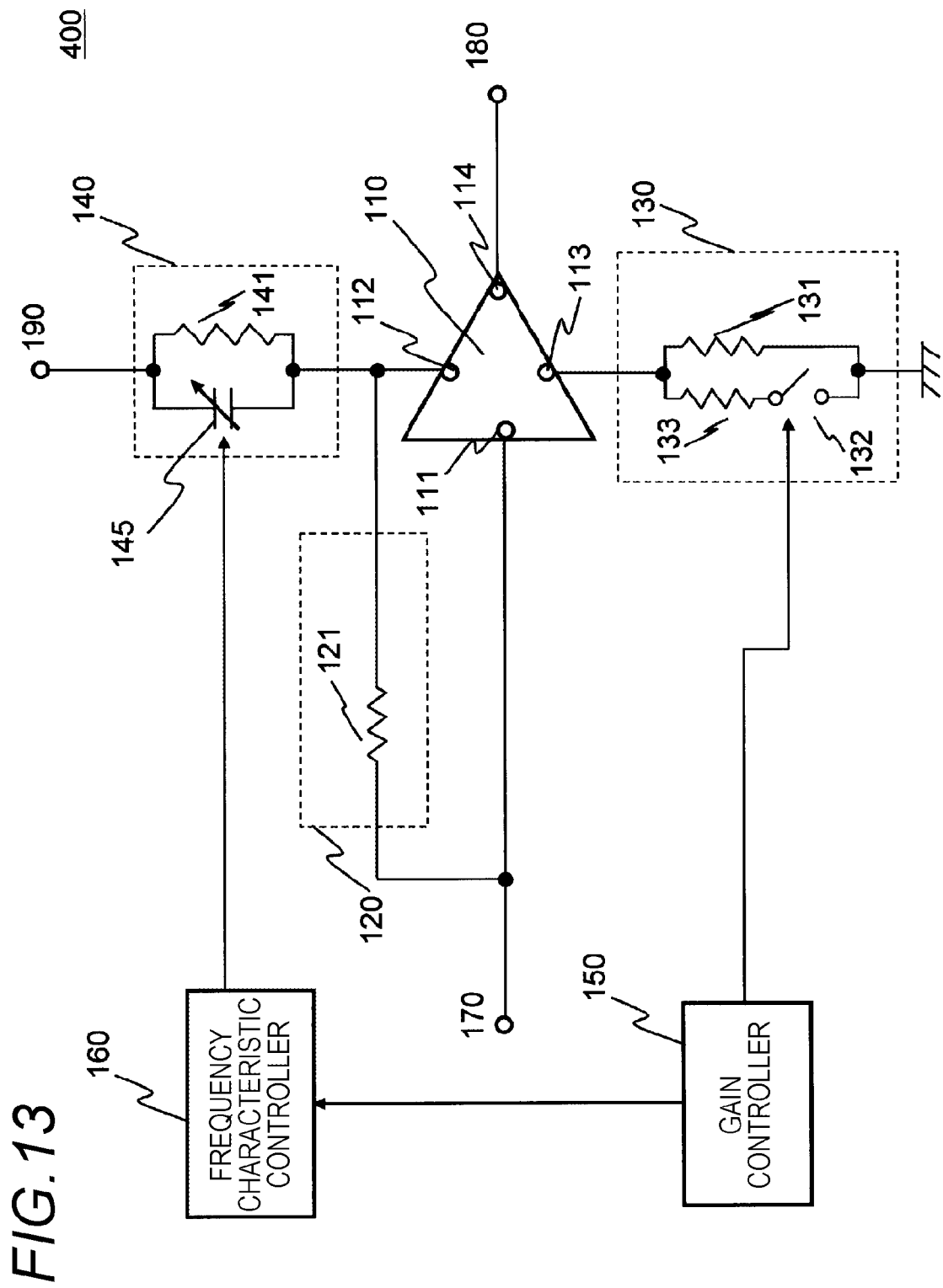
FIG. 13 is a diagram illustrating a circuit configuration of a variable gain amplifier according to a fourth embodiment.

FIG. 13 is a diagram illustrating a circuit configuration of a variable gain amplifier 400 according to a fourth embodiment. As compared with the variable gain amplifier 100 shown in FIG. 1, the variable gain amplifier 400 shown in FIG. 13 differs from the variable gain amplifier 100 in that the switch 122 is removed from the FB impedance section 120, and that a variable capacitor 135 is removed from the source impedance section 130 and a switch 132 and a resistor 133 are added thereto.

In the description of the variable gain amplifier 400 shown in FIG. 13, a description of components similar to the components of the variable gain amplifier 100 shown in FIG. 1 is simplified or omitted by attaching similar reference numerals to such components. Different components are described hereinafter.

The FB impedance section 130 includes the resistor 121 and to be connected between the gate terminal 111 and the drain terminal 112 of the transistor 110.

The source impedance section 130 includes the resistor 131, the switch 132 and the resistor 133, and to be connected between the source terminal 113 of the transistor 110 and the reference electric-potential (ground). In the source impedance section 130, the switch 132 and the resistor 133 are series-connected. The resistor 131 is parallel-connected to the switch 132 and the resistor 133. The impedance between the source terminal 113 of the transistor 110 and ground is changed due to change between ON and OFF of the switch 132.

The drain impedance section 140 includes a resistor 141 and a variable capacitor 145 and to be connected between the drain terminal 112 of the transistor 110 and the power supply terminal 190. In the drain impedance section 140, the resistor 141 and the variable capacitor 145 are parallel-connected. If the capacitance value of the variable capacitor 145 changes, the frequency characteristic of the impedance between the drain terminal 112 and the power supply terminal 190 changes.

The gain controller 150 sets the gain of the variable gain amplifier 400 by controlling ON and OFF of the switch 132 of the source impedance section 130. The gain controller 150 outputs a gain control signal including gain parameter information to the frequency characteristic portion 160.

The frequency character controller 160 receives the gain control signal output from the gain controller 150 and changes the capacitance value of the variable capacitor 145 of the drain impedance section 140, based on gain parameter information included in the gain control signal.

In the present embodiment, the frequency characteristic controller 160 reduces the in-band deviation of the gain, which is increased due to change between ON and OFF of the switch 132 of the source impedance section 130, which is caused by the gain controller 150, by changing the capacitance value of the variable capacitor 145 of the drain impedance section 140.

Accordingly, the frequency characteristic controller 160 reduces the in-band deviation of the gain, which is increased due to change of the impedance of the impedance section including a switch controlled by the gain controller 150 by changing the capacitance value of the impedance section differing from the impedance section controlled by the gain controller 150.

A control method for controlling the capacitance value of the variable capacitor 145 of the drain impedance section 140, which is performed by the frequency characteristic controller 160, is similar to the control method performed in the first embodiment.

Thus, similarly to the variable gain amplifier 100 according to the first embodiment, in the case of using a high-frequency signal, the variable gain amplifier 400 according to the fourth embodiment can reduce the in-band deviation of the gain, which is increased due to the parasitic capacitance of the switches in the source impedance section for setting the gain. Accordingly, the variable gain amplifier 400 can reduce signal distortion in an output signal Incidentally, the resistance value of the resistor 121 shown in FIG. 13 may be infinite. That is, if the resistor 121 is not present, and even if the gate terminal 111 and the drain terminal 112 are detached from each other by the FB impedance section 120, the variable gain amplifier 400 according to the present embodiment can achieve the same effect as that of the variable gain amplifier 100.

Fifth Embodiment

Figure 14:
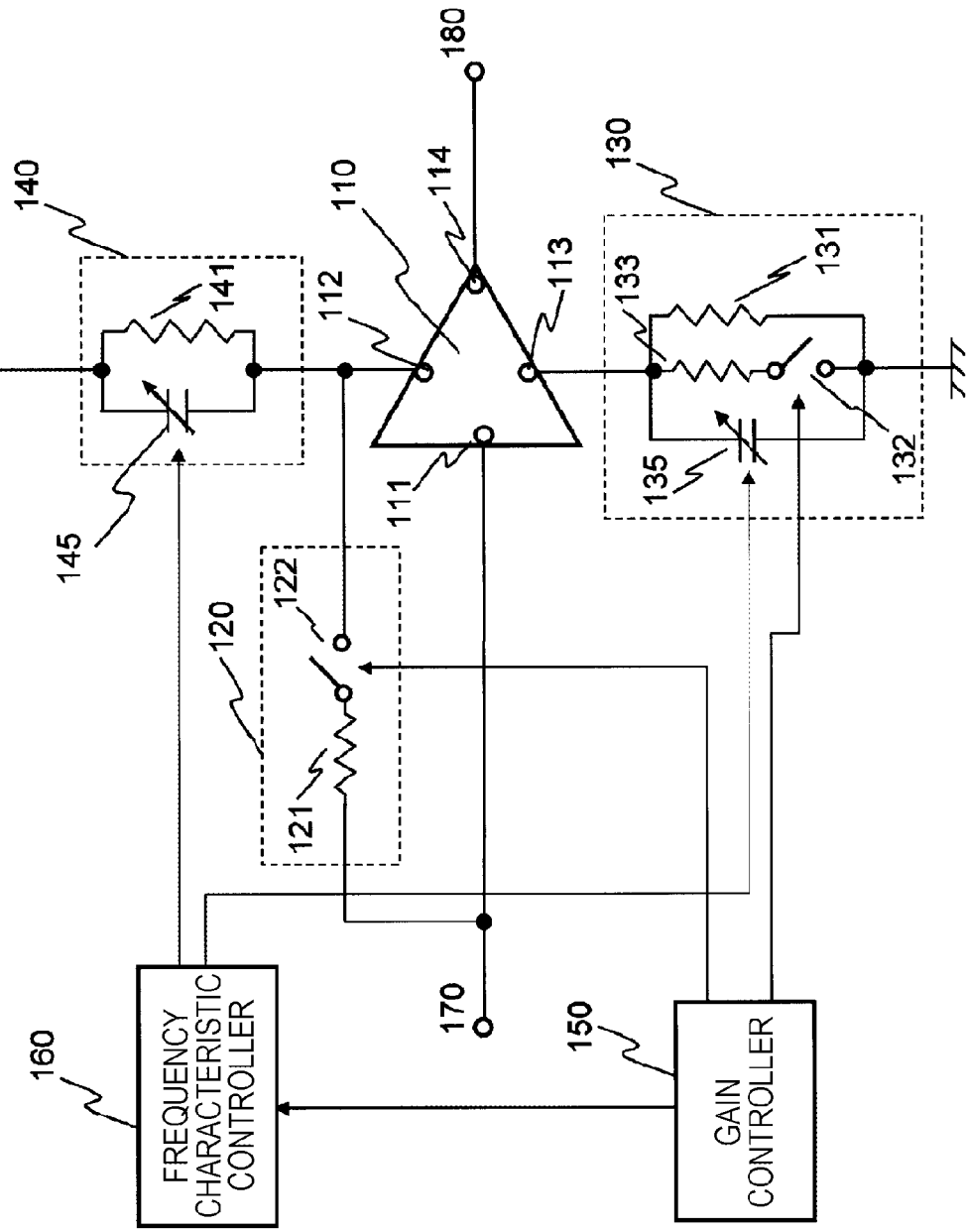
FIG. 14 is a diagram illustrating a circuit configuration of a variable gain amplifier according to a fifth embodiment.

FIG. 14 is a diagram illustrating a circuit configuration of a variable gain amplifier 500 according to a third embodiment. As compared with the variable gain amplifier 100 shown in FIG. 1, the variable gain amplifier 500 shown in FIG. 14 differs from the variable gain amplifier 100 in that the switch 132 and the resistor 133 are added to the FB impedance section, and that a variable capacitor 145 is added to the drain impedance section 140.

In the description of the variable gain amplifier 500 shown in FIG. 14, a description of components similar to the components of the variable gain amplifier 100 shown in FIG. 1 is simplified or omitted by attaching similar reference numerals to such components. Different components are described hereinafter.

The FB impedance section 120 includes the resistor 121 and the switch 122 and to be connected between the gate terminal 111 and the drain terminal 112 of the transistor 110. In the FB impedance section 120, the resistor 121 and the switch 122 are series-connected. The impedance between the gate terminal 111 and the drain terminal 112 of the transistor 110 is changed due to change between ON and OFF of the switch 122.

The source impedance section 130 includes the resistor 131, the switch 132, the resistor 133, and the variable capacitor 135 and to be connected between the source terminal 113 of the transistor 110 and the reference electric-potential (ground). In the source impedance section 130, the switch 132 and the resistor 133 are series-connected. The resistor 131 is parallel-connected to the switch 132 and the resistor 133. In addition, the variable capacitor 135 is also parallel-connected to the switch 132 and the resistor 133. The impedance between the source terminal 113 of the transistor 110 and ground is changed due to change between ON and OFF of the switch 132. If the capacitance value of the variable capacitor 135 changes, the frequency characteristic of the impedance between the source terminal 113 and ground is changed.

The drain impedance section 140 includes the resistor 141 and the variable capacitor 145 and to be connected between the drain terminal 112 of the transistor 110 and the power supply terminal 190. In the drain impedance section 140, the resistor 141 and the variable capacitor 145 are parallel-connected. If the capacitance value of the variable capacitor 145 changes, the frequency characteristic of the impedance between the drain terminal 112 and the power supply terminal 190 is changed.

The gain controller 150 sets the gain of the variable gain amplifier 500 by controlling ON and OFF of the switch 122 of the FB impedance section 120 and ON and OFF of the switch 132 of the source impedance section 130. The gain controller 150 outputs a control signal including gain parameter information to the frequency characteristic controller 160.

The frequency characteristic controller 160 receives the gain control signal output from the gain controller 150, and changes the capacitance value of each of the variable capacitor 135 of the source impedance section 130 and the variable capacitor 145 of the drain impedance section 140, based on the gain parameter information included in the gain control signal.

In the present embodiment, the frequency characteristic controller 160 reduces the in-band deviation of the gain, which is increased due to change between ON and OFF of the switch 132 of the source impedance section 130, which is caused by the gain controller 150, by changing the capacitance value of the variable capacitor 145 of the drain impedance section 140.

In addition, the frequency characteristic controller 160 reduces the in-band deviation of the gain, which is increased due to change between ON and OFF of the switch 122 of the impedance section 120, which is caused by the gain controller 150, by changing the capacitance value of the variable capacitor 135 of the source impedance section 130.

Accordingly, the frequency characteristic controller 160 reduces the in-band deviation of the gain, which is increased due to change of the impedance of the impedance section including the switch controlled by the gain controller 150 by changing the capacitance value of the variable capacitor of the impedance section differing from the impedance section controlled by the gain controller 150.

FIG. 15 is a diagram illustrating an example of a lookup table used in the fifth embodiment. In the present embodiment, the capacitance value of the variable capacitor 135 is set at the capacitance value $C_S$ (e.g., $C_1$ corresponding to a gain parameter set by the gain controller 150. The capacitance value of the variable capacitor 145 is set at a capacitance value $C_D$ (e.g., $C_5$).

A control method for controlling the capacitance value of the variable capacitor 135 of the drain impedance section 140 and the capacitance value of the variable capacitor 145 of the drain impedance section 140 is similar to the method according to the first embodiment. Thus, description of this control method is omitted.

The variable gain amplifier 500 shown in FIG. 14 is such that the gain is set at the FB impedance section 120, that the gain is set and the frequency characteristic of the gain due to change of the variable capacitor is controlled at the source impedance section 130, and that the frequency characteristic of the gain due to change of the variable capacitor is controlled at the drain impedance section 140. However, the variable gain amplifier 500 according to the present embodiment may cause the variable gain amplifier 500 sets the FB impedance section 120, the source impedance section 130, and the drain impedance section to play one of the following four roles.

(1) The gain controller 150 does not set the gain. The frequency characteristic controller 160 does not control the frequency characteristic of the gain due to change of the variable capacitor.

(2) The gain controller 150 sets the gain. The frequency characteristic controller 160 does not control the frequency characteristic of the gain due to change of the variable capacitor.

(3) The frequency characteristic controller 160 controls the frequency characteristic of the gain due to change of the variable capacitor due to change of the variable capacitor. The gain controller 150 does not set the gain.

(4) The gain controller 150 sets the gain. The frequency characteristic controller 160 controls the frequency characteristic of the gain due to change of the variable capacitor.

However, the variable gain amplifier 500 sets the gain controls the frequency characteristic of the gain due to change of the variable capacitor in at least one of the FB impedance section 120, the source impedance section 130 and the drain impedance section 140.

Thus, similarly to the variable gain amplifier 100 of the first embodiment, in the case of using a high-frequency signal, the variable gain amplifier 500 according to the fifth embodiment can reduce the in-band deviation of the gain, which is increased due to the parasitic capacitance of each switch of the source impedance section and the FB impedance section for setting a gain. Accordingly the variable gain amplifier 500 can reduce signal distortion in output signals.

Sixth Embodiment

Figure 16:
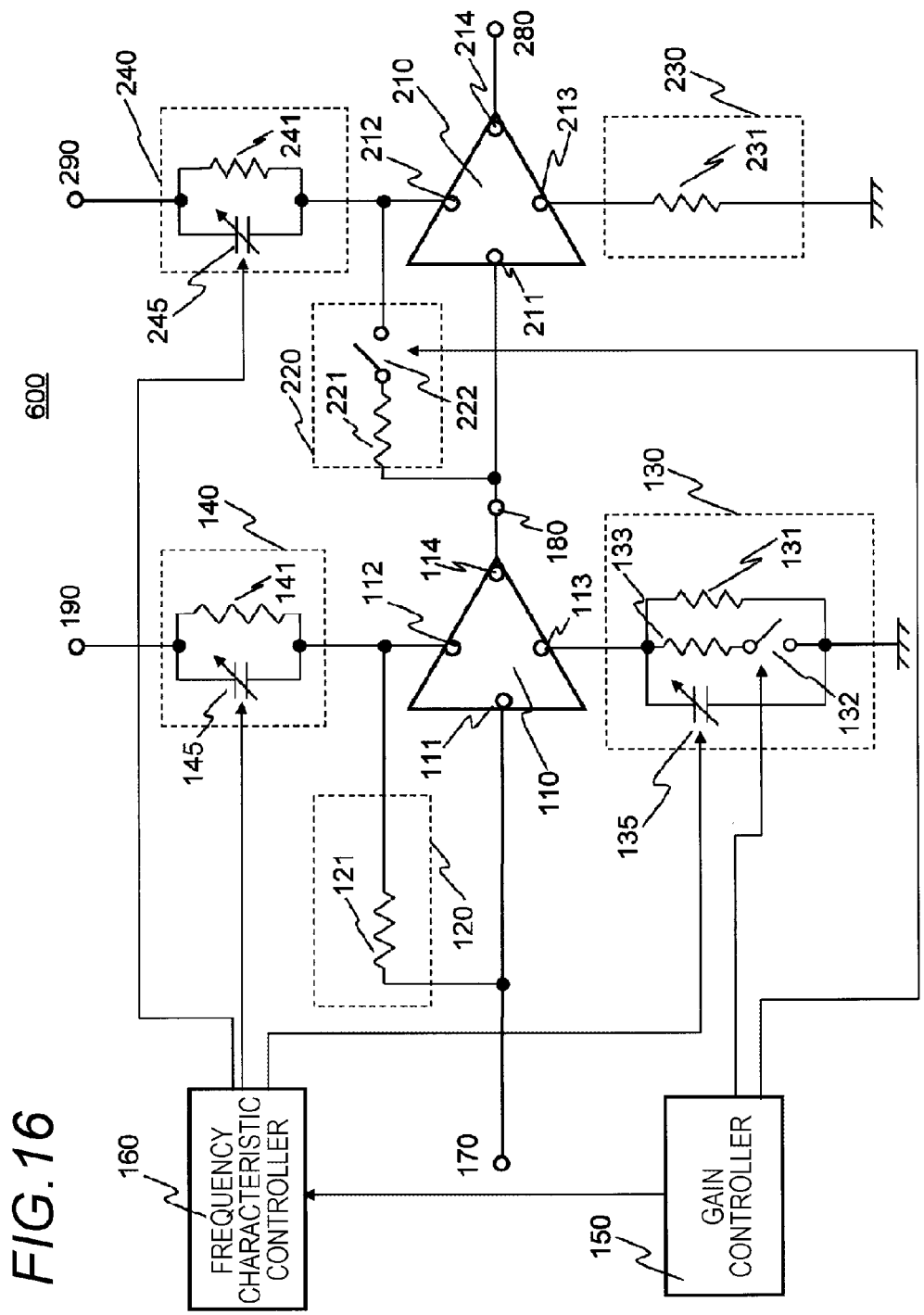
FIG. 16 is a diagram illustrating a circuit configuration of a variable gain amplifier according to a sixth embodiment.

FIG. 16 is a diagram illustrating a circuit configuration of a variable gain amplifier 600 according to a sixth embodiment. As compared with the variable gain amplifier 100 shown in FIG. 1, the variable gain amplifier 600 shown in FIG. 16 differs from the variable gain amplifier 100 in that a transistor 210 is cascade-connected to the transistor 110.

Particularly, the variable gain amplifier 600 includes transistors 110 and 210, FB impedance sections 120 and 220, the source impedance sections 130 and 230, drain impedance sections 140 and 240, a gain controller 150, a frequency characteristic controller 160, an input terminal 170, output terminals 180 and 280, and power supply terminals 190 and 290.

The transistor 210 serving as the amplifying element includes a gate terminal 211 serving as a control terminal to which an output signal from the transistor 110 is input, a drain terminal 212 serving as a power-supply-side terminal connected to a direct-current power supply, a source terminal 213 serving as a reference-side terminal connected to the reference electric-potential (e.g., ground), and an output terminal 214.

A signal amplified at the transistor 110 is input to the gate terminal 211 and the FB impedance section 220 of the transistor 210 via the output terminals 114 and 180. The transistor 210 amplifies an input signal input to the gate terminal 211, and outputs the amplified signal from the output terminal 214 to the output terminal 280. A direct-current voltage is applied via the power supply terminal 290 and the drain impedance section 240 to the drain terminal 212. The source terminal 213 is grounded via the source impedance section 230.

The FB impedance section 120 includes the resistor 121 and to be connected between the gate terminal 111 and the drain terminal 112 of the transistor 110.

The FB impedance section 220 includes a resistor 221 and a switch 222 and connected between the gate terminal 211 and the drain terminal 212 of the transistor 210. In the FB impedance section 220, the resistor 221 and the switch 222 are series-connected. The impedance between the gate terminal 211 and the drain terminal 212 of the transistor 210 is changed due to change between ON and OFF of the switch 222.

The source impedance section 130 includes a resistor 131, a switch 132, a resistor 133, and a variable capacitor 135 and to be connected between the source terminal 113 of the transistor 110 and the reference electric-potential (ground). In the source impedance section 130, the switch 132 and the resistor 133 are series-connected. The resistor 131 is parallel-connected to the switch 132 and the resistor 133. Additionally, a variable capacitor 136 is also parallel-connected to the switch 132 and the resistor 133. The impedance between the source terminal 113 of the transistor 110 and ground is changed due to change between ON and OFF of the switch 132. If the capacitance value of the variable capacitor 135 is changed, the frequency characteristic of the impedance between the source terminal 113 and ground changes.

A source impedance section 230 includes a resistor 231 and to be connected between the source terminal 213 of the transistor 210 and the reference electric-potential (ground).

The drain impedance section 140 includes the resistor 141 and the variable capacitor 145 and connected between the drain terminal 112 of the transistor 110 and the power supply terminal 190. In the drain impedance section 140, the resistor 141 and the variable capacitor 145 are parallel-connected. If the capacitance value of the variable capacitor 145 is changed, the frequency characteristic of the impedance between the drain terminal 112 and the power supply terminal 190 changes.

The drain impedance section 240 includes a resistor 241 and a variable capacitor 245 and to be connected between the drain terminal 212 of the transistor 210 and the power supply terminal 290. In the drain impedance section 240, the resistor 241 and the variable capacitor 245 are parallel-connected. If the capacitance value of the variable capacitor 245 changes, the frequency characteristic of the impedance between the drain terminal 212 and the power supply terminal 290 is changed.

The gain controller 150 sets the gain of the variable gain amplifier 600 at a desired value by controlling between ON and OFF of the switch 132 of the source impedance section 130 and ON and OFF of a switch 222 of the FB impedance section 220. The gain controller 150 outputs a gain control signal including gain parameter information to the frequency characteristic controller 160.

The frequency characteristic controller 160 receives the gain control signal output from the gain controller 150 and changes the capacitance value of each of the variable capacitor 135 of the source impedance section 130, the variable capacitor 145 of the drain impedance section 140, the variable capacitor 245 of the drain impedance section 240.

In the present embodiment, the frequency characteristic controller 160 reduces the in-band deviation of the gain, which is increased due to change between ON and OFF of the switch 132 of the source impedance section 130 by changing the capacitance value of each of the variable capacitors 145 and 245 of the drain impedance sections 140 and 240.

Additionally, the frequency characteristic controller 160 reduces the in-band deviation of the gain, which is increased due to change between ON and OFF of the switch 222 of the FB impedance section 22 due to the gain controller 150 by changing the capacitance value of the variable capacitor 135 of the source impedance section 130.

Accordingly, the frequency characteristic controller 160 reduces the in-band deviation of the gain, which is increased due to change of the impedance of the impedance section including the switch controlled by the gain controller 150 by changing the capacitance value of the variable capacitor of the impedance section differing from the impedance section controlled by the gain controller 150.

FIG. 17 is a diagram illustrating an example of a lookup table used in the sixth embodiment. In the present embodiment, the capacitance value of the variable capacitor 135 is set at the capacitance value $C_{S1}$ (e.g., $C_1$, the capacitance value of the variable capacitor 145 is set at the capacitance value $C_{D1}$ (e.g., $C_5$), and the capacitance value of the variable capacitor 245 is set at the capacitance value $C_{D2}$ (e.g., $C_9$) corresponding to the gain parameter (e.g., $G_1$) set by the gain controller 150.

A control method for controlling the capacitance value of the variable capacitor 135 of the source impedance section 130, and the capacitance value of each of the variable capacitors 145 and 245 of the drain impedance sections 140 and 240 is similar to the control method according to the first embodiment. Therefore, a description of the control method is omitted.

The variable gain amplifier 600 shown in FIG. 16 is such that a gain is set in the FB impedance section 220, that a gain is set and the frequency characteristic of the gain due to change of the variable capacitor is controlled in the source impedance section 130, and that the frequency characteristic of the gain due to change of the variable capacitor is controlled in each of the drain impedance sections 140 and 240. However, the variable gain amplifier 600 according to the present embodiment may cause each of the FB impedance sections 120 and 220, the source impedance sections 130 and 230, and the drain impedance sections 140 and 240 to perform one of the following four roles.

(1) The gain controller 150 does not set the gain. The frequency characteristic controller 160 does not control the frequency characteristic of the gain due to change of the variable capacitor.

(2) The gain controller 150 sets the gain. The frequency characteristic controller 160 does not control the frequency characteristic of the gain due to change of the variable capacitor.

(3) The frequency characteristic controller 160 controls the frequency characteristic of the gain due to change of the variable capacitor. The gain controller 150 does not set the gain.

(4) The gain controller 150 sets the gain. The frequency characteristic controller 160 controls the frequency characteristic of the gain due to change of the variable capacitor.

However, the variable gain amplifier 600 is such that a gain is set in at least one of the FB impedance sections 120 and 220, the source impedance sections 130 and 230, and the drain impedance sections 140 and 240, and that the frequency characteristic of the gain due to change of the variable capacitor is controlled in at least one of the impedance sections.

Thus, similarly to the variable gain amplifier 100 according to the first embodiment, in the case of using high-frequency signals, the variable gain amplifier 600 according to the sixth embodiment can reduce the in-band deviation increased due to the parasitic capacitance of the switch of each of the source impedance section and the FB impedance section for setting a gain. Accordingly, the variable gain amplifier 600 can reduce a signal distortion in an output signal.

In the foregoing description, various embodiments have been described with reference to the drawings. However, obviously, the present disclosure is not limited to such examples. It is apparent that those skilled in the art conceive various modifications and alterations within the scope of the claims. It is understood that the modifications and alterations are within the technical scope of the present disclosure.

The present application is based on Japanese Patent Application No. 2011-278449 filed on Dec. 20, 2011, the contents of which are incorporated herein by reference.

INDUSTRIAL APPLICABILITY

The present disclosure relates to a variable gain amplifier that achieves the adaptive in-band deviation compensation according to gain setting, and is useful as a variable gain amplifier in a wireless communication device.

REFERENCE SIGNS LIST 100, 100a, 100b, 100c, 200, 300, 400, 500, 600: variable gain amplifier 110, 110p, 110n, 210: transistor
120, 120p, 120n, 220: FB impedance section
130, 130p, 130n, 130pn, 230: source impedance section
140, 140p, 140n, 240: drain impedance section
150: gain controller
160: frequency characteristic controller

The invention claimed is:

1. A variable gain amplifier comprising:
an amplifying element including a control terminal to which an input signal is input, a reference-side terminal connected to reference electric-potential, and a power-supply-side terminal connected to a direct-current power supply, the amplifying element configured to amplify the input signal;
an FB impedance section connected between the control terminal and the power-supply-side terminal;
a reference-side impedance section connected to the reference-side terminal;
a power-supply-side impedance section connected to the power-supply-side terminal;
a gain controller configured to control a gain of the amplifying element; and
a frequency characteristic controller configured to control a frequency characteristic of the gain, wherein
the gain controller varies an impedance of one impedance section of the FB impedance section, the reference-side impedance section, and the power-supply-side impedance section, and outputs a control signal for controlling the gain, and
the frequency characteristic controller varies an impedance of an impedance section differing from the one impedance section, based on the control signal for controlling the gain.

2. The variable gain amplifier according to claim 1, wherein
at least one impedance section of the FB impedance section, the reference-side impedance section, and the power-supply-side impedance section includes at least one switch, and
the gain controller changes the switch between ON and OFF of at least one impedance section of the FB impedance section, the reference-side impedance section, and the power-supply-side impedance section.

3. The variable gain amplifier according to claim 1, wherein
at least one impedance section of the FB impedance section, the reference-side impedance section, and the power-supply-side impedance section includes a variable capacitor, and
the frequency characteristic controller varies the variable capacitor of at least one impedance section of the FB impedance section, the reference-side impedance section, and the power-supply-side impedance section.

4. The variable gain amplifier according to claim 3, further comprising:
a table which defines a gain parameter included in the control signal and a capacitance value of the variable capacitor, which corresponds to the gain parameter, wherein
the frequency characteristic controller varies the variable capacitor of at least one impedance section of the FB impedance section, the reference-side impedance section, and the power-supply-side impedance section, the variable capacitor being varied into a capacitance value of the variable capacitor corresponding to the gain parameter.

5. The variable gain amplifier according to claim 3, wherein
the gain controller changes the switch between ON and OFF of the power-supply-side impedance section, and
the frequency characteristic controller varies the variable capacitor of the reference-side impedance section.

6. The variable gain amplifier according to claim 3, wherein
the gain controller changes the switch between ON and OFF of the reference-side impedance section, and
the frequency characteristic controller varies the variable capacitor of the FB impedance section.

7. The variable gain amplifier according to claim 3, wherein
the gain controller changes the switch between ON and OFF of the reference-side impedance section, and
the frequency characteristic controller varies the variable capacitor of the power-supply-side impedance section.

8. The variable gain amplifier according to claim 3, wherein
the gain controller varies the switch between ON and OFF of the FB impedance section and varies the switch between ON and OFF of the reference-side impedance section, and
the frequency characteristic controller varies the variable capacitor of the reference-side impedance section in correspondence to change of the switch between ON and OFF of the FB impedance section, and varies the variable capacitor of the power-supply-side impedance section in correspondence to change of the switch between ON and OFF of the reference-side impedance section.

9. The variable gain amplifier according to claim 3, further comprising:
a second amplifying element including a second control terminal to which an output signal from the amplifying element is input, a second reference-side terminal connected to the reference electric-potential, and a second power-supply-side terminal connected to the direct-current power supply, the second amplifying element configured to amplify the output signal from the amplifying element;
a second FB impedance section connected between the second control terminal and the second power-supply-side terminal and including at least one switch; and
a second power-supply-side impedance section connected to the second power-supply-side terminal and including a variable capacitance, wherein
the gain controller changes the switch between ON and OFF of the reference-side impedance section and changes the switch between ON and OFF of the second FB impedance section, and
the frequency characteristic controller varies the variable capacitor of each of the power-supply-side impedance section and the second power-supply-side impedance section in correspondence to change of the switch between ON and OFF of the reference-side impedance section, and the frequency characteristic controller varies the variable capacitor of the reference-side impedance section in correspondence to change of the switch between ON and OFF of the second FB impedance section.

10. The variable gain amplifier according to claim 1, further comprising:
a third-amplifying element including a third control terminal to which a second input signal, which indicates a differential input signal with respect to the input signal, is input, a third reference-side signal connected to the reference electric-potential, and a third power-supply-side terminal connected to the direct-current power supply, the amplifying element and the third-amplifying element form a differential pair;

a third FB impedance section connected between the third control terminal and the third power-supply-side terminal and including at least one switch; and a third reference-side impedance section connected to the third reference-side terminal and including a variable capacitor, wherein the gain controller changes the switch between ON and OFF of the FB impedance section and changes the switch between ON and OFF of the third FB impedance section, and the frequency characteristic controller varies the variable capacitor of the reference-side impedance section in correspondence to change of the switch between ON and OFF of the FB impedance section and varies the variable capacitor of the third reference-side impedance section in correspondence to change of the switch between ON and OFF of the third FB impedance section.

11. The variable gain amplifier according to claim 1, further comprising:

a third-amplifying element including a third control terminal to which a second input signal, which indicates a differential input signal with respect to the input signal, is input, a third reference-side signal connected to the reference electric-potential, and a third power-supply-side terminal connected to the direct-current power supply, the amplifying element and the third-amplifying element form a differential pair; and a third FB impedance section connected between the third control terminal and the third power-supply-side terminal and including at least one switch, wherein the reference-side impedance section is configured to connect the variable capacity of the reference-side impedance section to the reference-side terminal and the third reference-side terminal, the gain controller changes the switch between ON and OFF of the FB impedance section and changes the switch between ON and OFF of the third FB impedance section, and the frequency characteristic controller varies the variable capacitor of the reference-side impedance section in correspondence to change of the switch between ON and OFF of each of the FB impedance section and the third FB impedance section.

* * * * *